US012149856B2

(12) United States Patent
Kobayashi et al.

(10) Patent No.: US 12,149,856 B2
(45) Date of Patent: Nov. 19, 2024

(54) PHOTOELECTRIC CONVERSION DEVICE AND METHOD OF DRIVING PHOTOELECTRIC CONVERSION DEVICE

(71) Applicant: CANON KABUSHIKI KAISHA, Tokyo (JP)

(72) Inventors: Hideo Kobayashi, Tokyo (JP); So Hasegawa, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 157 days.

(21) Appl. No.: 18/158,554

(22) Filed: Jan. 24, 2023

(65) Prior Publication Data

US 2023/0247332 A1 Aug. 3, 2023

(30) Foreign Application Priority Data

Jan. 31, 2022 (JP) .................. 2022-012748

(51) Int. Cl.
*H04N 25/78* (2023.01)
*H01L 27/146* (2006.01)
*H04N 25/618* (2023.01)
*H04N 25/709* (2023.01)
*H04N 25/766* (2023.01)

(52) U.S. Cl.
CPC .......... *H04N 25/78* (2023.01); *H04N 25/709* (2023.01); *H04N 25/766* (2023.01); *H01L 27/14634* (2013.01); *H04N 25/618* (2023.01)

(58) Field of Classification Search
CPC .... H04N 25/78; H04N 25/709; H04N 25/766; H04N 25/618; H01L 27/14634
See application file for complete search history.

(56) References Cited

U.S. PATENT DOCUMENTS

| 7,321,329 B2 * | 1/2008 | Tooyama | H03M 1/08 |
| | | | 348/E5.079 |
| 7,990,440 B2 | 8/2011 | Kobayashi | |
| 8,710,558 B2 | 4/2014 | Inoue | |

(Continued)

FOREIGN PATENT DOCUMENTS

| JP | 2011-35689 A | 2/2011 |
| JP | 2011-82929 A | 4/2011 |

(Continued)

OTHER PUBLICATIONS

U.S. Appl. No. 17/963,289, filed Oct. 11, 2022 by Hideo Kobayashi.

(Continued)

*Primary Examiner* — Nicholas G Giles
(74) *Attorney, Agent, or Firm* — VENABLE LLP

(57) ABSTRACT

A photoelectric conversion device includes a plurality of pixels arranged to form a plurality of columns, a plurality of comparison circuits provided corresponding to the plurality of columns and including a first input node to which a pixel signal output from a pixel of a corresponding column is input and a second input node to which a reference signal is input, a plurality of buffer circuits provided between a reference signal line to which the reference signal is supplied and each of the second input nodes of the plurality of comparison circuits, and a first switch circuit configured to set a connection state between output nodes of the plurality of buffer circuits.

22 Claims, 16 Drawing Sheets

(56) References Cited

U.S. PATENT DOCUMENTS

| | | | |
|---|---|---|---|
| 8,884,391 | B2 | 11/2014 | Fudaba |
| 9,264,641 | B2 | 2/2016 | Kobayashi |
| 9,305,954 | B2 | 4/2016 | Kato |
| 9,357,122 | B2 | 5/2016 | Kususaki |
| 9,407,847 | B2 | 8/2016 | Maehashi |
| 9,438,828 | B2 | 9/2016 | Itano |
| 9,509,931 | B2 | 11/2016 | Kobayashi |
| 9,602,752 | B2 | 3/2017 | Kobayashi |
| 10,015,430 | B2 | 7/2018 | Kobayashi |
| 10,084,982 | B2 * | 9/2018 | Kim ............ H04N 25/76 |
| 10,609,316 | B2 | 3/2020 | Kobayashi |
| 11,070,182 | B2 * | 7/2021 | Jung ............ H03F 3/68 |
| 11,268,851 | B2 | 3/2022 | Kobayashi |
| 11,431,929 | B2 | 8/2022 | Kobayashi |
| 11,463,644 | B2 | 10/2022 | Soda |
| 11,470,275 | B2 | 10/2022 | Kobayashi |
| 11,496,704 | B2 | 11/2022 | Sato |
| 11,616,925 | B2 | 3/2023 | Kobayashi |
| 11,653,114 | B2 | 5/2023 | Nakazawa |
| 2007/0008206 | A1 * | 1/2007 | Tooyama ............ H04N 25/77 |
| | | | 348/E5.079 |
| 2011/0025900 | A1 | 2/2011 | Kondo |
| 2016/0205333 | A1 | 7/2016 | Shishido et al. |
| 2016/0301891 | A1 * | 10/2016 | Kim ............ H04N 25/677 |
| 2018/0287599 | A1 | 10/2018 | Tomita et al. |
| 2020/0266785 | A1 * | 8/2020 | Jung ............ H03F 3/505 |
| 2021/0360180 | A1 | 11/2021 | Saito |
| 2022/0030164 | A1 | 1/2022 | Kobayashi |
| 2022/0247964 | A1 | 8/2022 | Kobayashi |
| 2022/0302199 | A1 | 9/2022 | Kobayashi |
| 2022/0303484 | A1 | 9/2022 | Kobayashi |
| 2022/0303485 | A1 | 9/2022 | Kobayashi |
| 2022/0303486 | A1 | 9/2022 | Kobayashi |
| 2022/0321812 | A1 | 10/2022 | Kobayashi |
| 2023/0041974 | A1 | 2/2023 | Kobayashi |
| 2023/0070568 | A1 | 3/2023 | Kobayashi |
| 2023/0072715 | A1 | 3/2023 | Kobayashi |
| 2023/0117988 | A1 | 4/2023 | Kobayashi |

FOREIGN PATENT DOCUMENTS

| | | |
|---|---|---|
| WO | 2015/079597 A1 | 6/2015 |
| WO | 2016/076127 A1 | 5/2016 |

OTHER PUBLICATIONS

U.S. Appl. No. 17/971,797, filed Oct. 24, 2022 by Hideo Kobayashi.
U.S. Appl. No. 17/981,657, filed Nov. 7, 2022 by Hideo Kobayashi.
U.S. Appl. No. 18/074,642, filed Dec. 5, 2022 by Kazuo Yamazaki.
U.S. Appl. No. 18/068,622, filed Dec. 20, 2022 by Hideo Kobayashi.
U.S. Appl. No. 18/168,347, filed Feb. 13, 2023 by Hideo Kobayashi.

* cited by examiner

PHOTOELECTRIC CONVERSION DEVICE AND METHOD OF DRIVING PHOTOELECTRIC CONVERSION DEVICE

BACKGROUND OF THE INVENTION

Field of the Invention

The present invention relates to a photoelectric conversion device and a method of driving a photoelectric conversion device.

Description of the Related Art

An imaging device equipped with a column-parallel analog-to-digital (AD) converter including an AD converter for each pixel column is known. In a typical column-parallel AD converter, a comparison circuit compares a reference signal whose level changes with lapse of time with a pixel signal, and the time from the start of comparison until the output signal of the comparison circuit is inverted is counted to convert the pixel signal into digital data. International Publication No. WO2016/076127 describes an imaging device configured to reduce the settling time of a reference signal by connecting a buffer circuit between a reference signal line and a comparison circuit.

In recent years, the use of photoelectric conversion devices typified by imaging devices has been expanded, and photoelectric conversion devices having various functions according to the use have been expected. In addition, in an imaging device equipped with a column-parallel AD converter, it is important to suppress a change in the amount of variation in the power supply voltage caused by a difference in the number of comparison circuits in which the output signal levels are inverted at the same time. However, in International Publication No. WO2016/076127, in a configuration that a buffer circuit is provided between a reference signal line and a comparison circuit, no particular consideration has been given to variations in power supply voltage.

SUMMARY OF THE INVENTION

It is an object of the present invention to provide a technique for realizing multifunctionalization and improvement of image quality in a photoelectric conversion device including a column-parallel AD converter.

According to an embodiment of the present specification, there are provided a photoelectric conversion device including a plurality of pixels arranged to form a plurality of columns, a plurality of comparison circuits provided corresponding to the plurality of columns, each of the plurality of comparison circuits including a first input node to which a pixel signal output from a pixel of a corresponding column is input and a second input node to which a reference signal is input, a plurality of buffer circuits provided between a reference signal line to which the reference signal is supplied and each of the second input nodes of the plurality of comparison circuits, and a first switch circuit configured to set a connection state between output nodes of the plurality of buffer circuits.

According to another embodiment of the present specification, there is provided a photoelectric conversion device including a plurality of pixels arranged to form a plurality of columns, a plurality of comparison circuits provided corresponding to the plurality of columns, each of the plurality of comparison circuit including a first input node to which a pixel signal output from a pixel of a corresponding column is input via a first capacitor and a second input node to which a reference signal is input via a second capacitor, a plurality of buffer circuits provided between the reference signal line to which the reference signal is supplied and each of the second input nodes of the plurality of comparison circuits, a switch circuit configured to switch a connection state between output nodes of the plurality of buffer circuits, and a control circuit configured to control the switch circuit, wherein the comparison circuit is enabled to perform an offset clamp operation of setting an offset based on voltages input to the first input node and the second input node, and wherein the control circuit is configured to connect between the output nodes of the plurality of buffer circuits during at least a part of a period during which the offset clamp operation is performed.

According to still another embodiment of the present specification, there are provided a method of driving a photoelectric conversion device including a plurality of pixels arranged to form a plurality of columns, a plurality of comparison circuits provided corresponding to the plurality of columns and including a first input node to which a pixel signal output from a pixel of a corresponding column is input and a second input node to which a reference signal is input, a plurality of buffer circuits provided between a reference signal line to which the reference signal is supplied and each of the second input nodes of the plurality of comparison circuits, and a switch circuit configured to be enabled to switch a connection state between output nodes of the plurality of buffer circuits, the method including connecting the output nodes of the plurality of buffer circuits by turning on the switch circuit in a first operation mode, and disconnecting the output nodes of the plurality of buffer circuits by turning off the switch circuit in a second operation mode.

According to still another embodiment of the present specification, there is provided a method of driving a photoelectric conversion device including a plurality of pixels arranged to form a plurality of columns, a plurality of comparator circuits provided corresponding to the plurality of columns and including a first input node to which a pixel signal output from a pixel of a corresponding column is input, a second input node to which a reference signal is input, and a reset switch configured to reset a threshold voltage to a voltage corresponding to a potential difference between the first input node and the second input node, a plurality of buffer circuits provided between a reference signal line to which the reference signal is supplied and each of the second input nodes of the plurality of comparison circuits, and a switch circuit configured to be enabled to switch a connection state between output nodes of the plurality of buffer circuits, the method including connecting the output nodes of the plurality of buffer circuits by turning on the switch circuit, and turning on the switch circuit during at least a part of a period in which the reset switch is turned on.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

Figure 1:
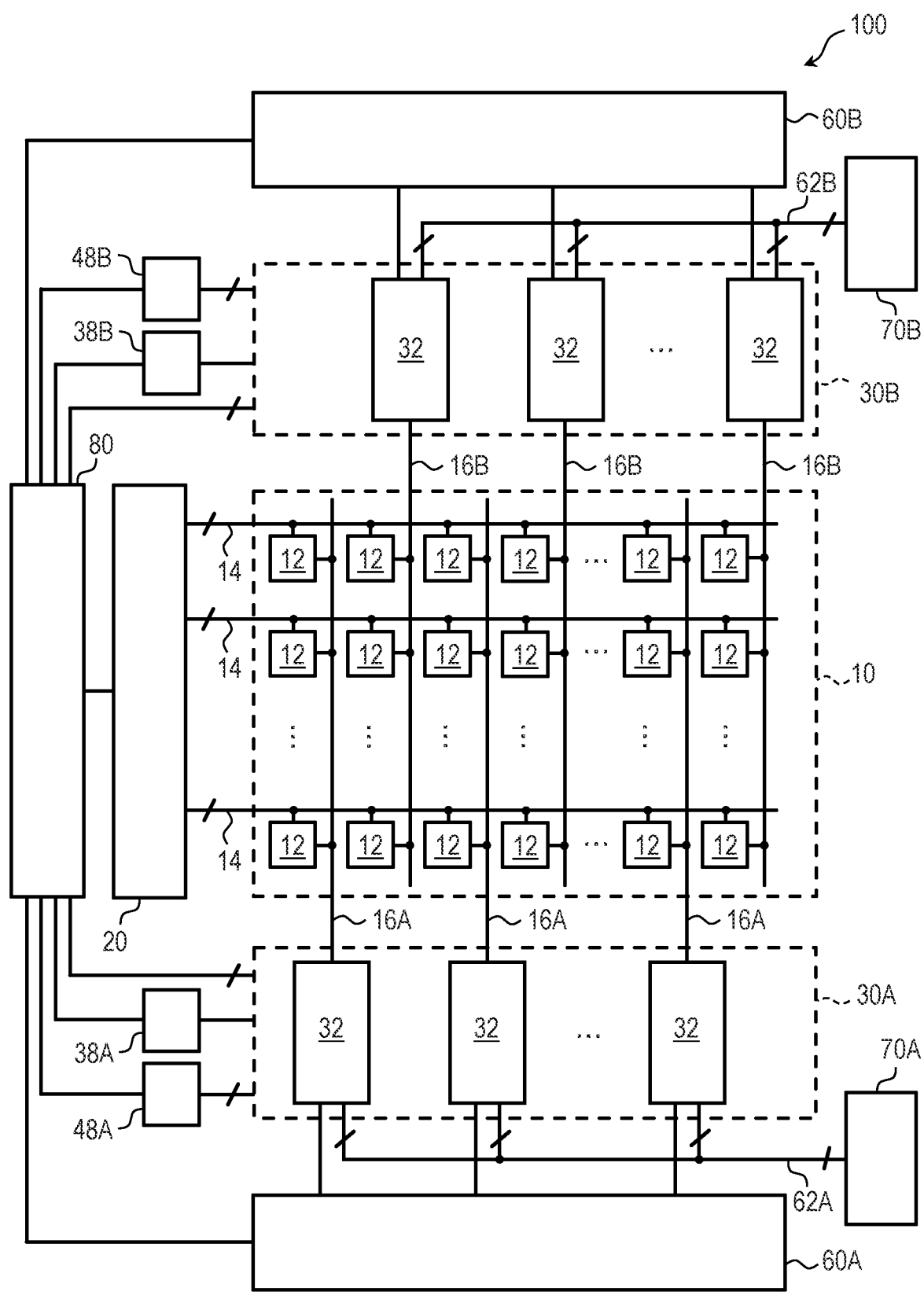
FIG. 1 is a block diagram illustrating a schematic configuration of a photoelectric conversion device according to a first embodiment of the present invention.
Figure 2:
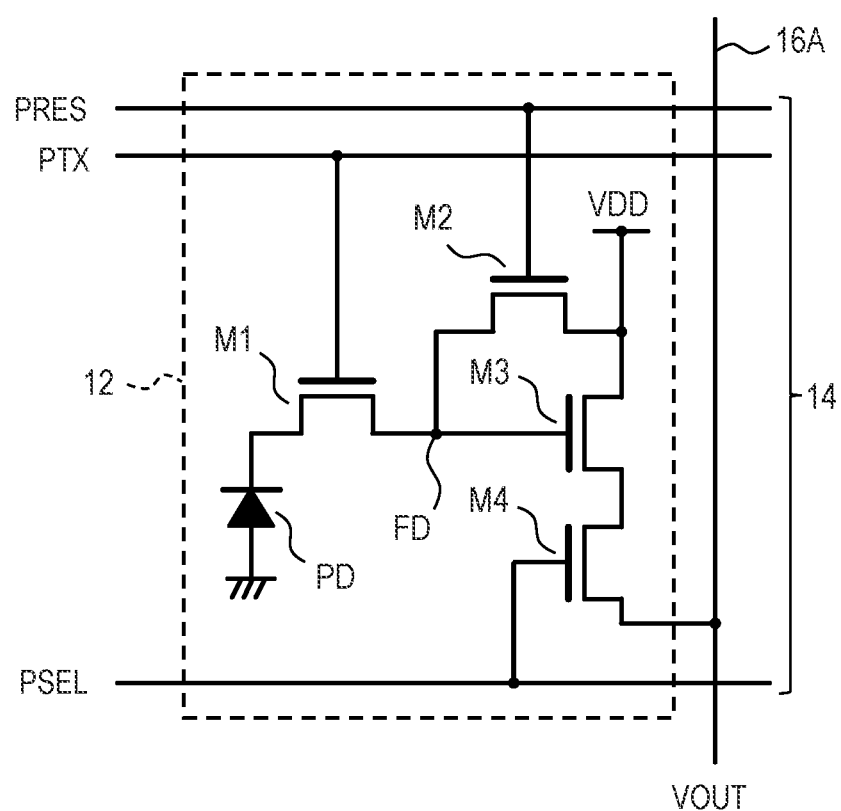
FIG. 2 is a circuit diagram illustrating a configuration example of a pixel in the photoelectric conversion device according to the first embodiment of the present invention.
Figure 3:
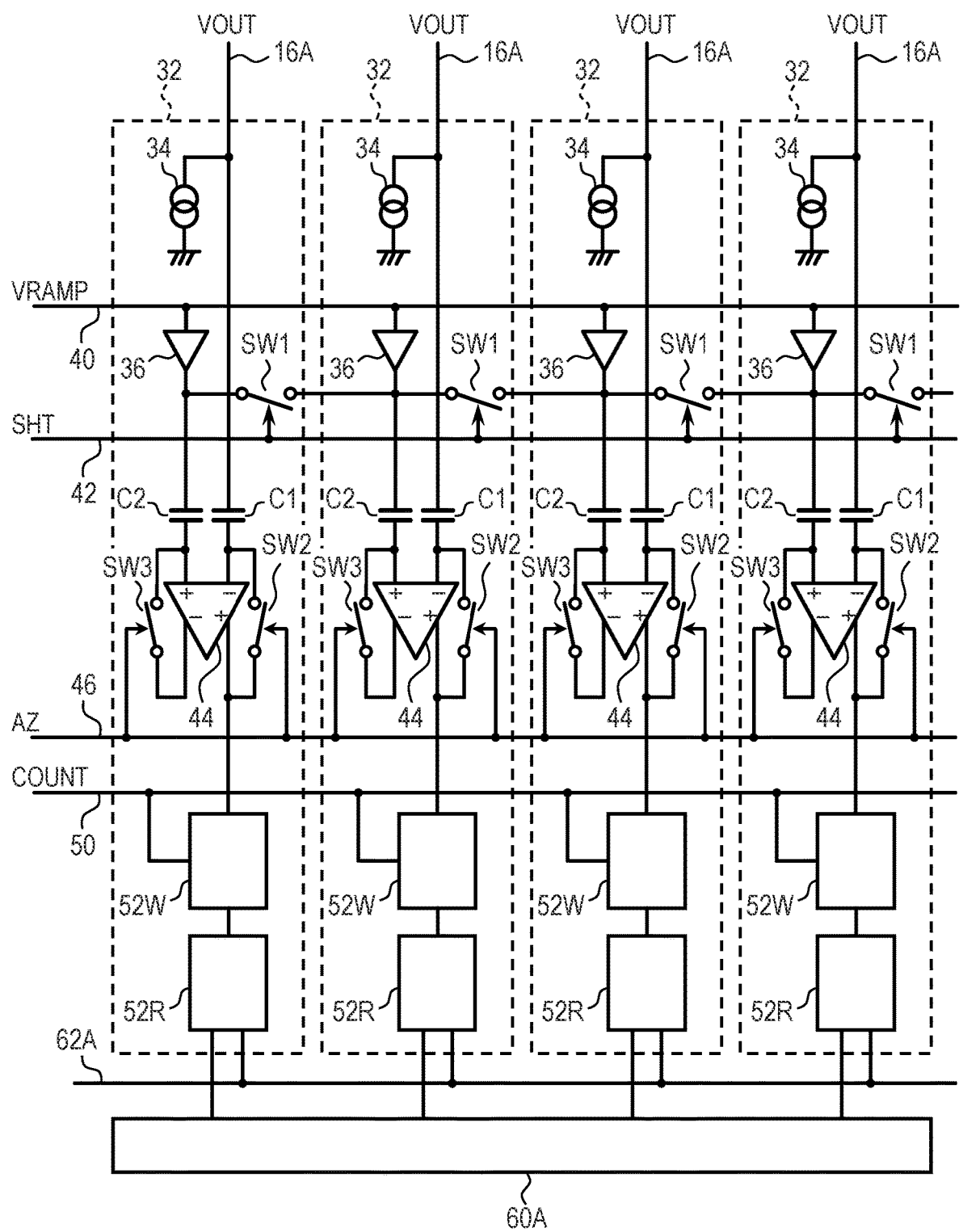
FIG. 3 is a circuit diagram illustrating a configuration example of a column circuit in the photoelectric conversion device according to the first embodiment of the present invention.
Figure 4:
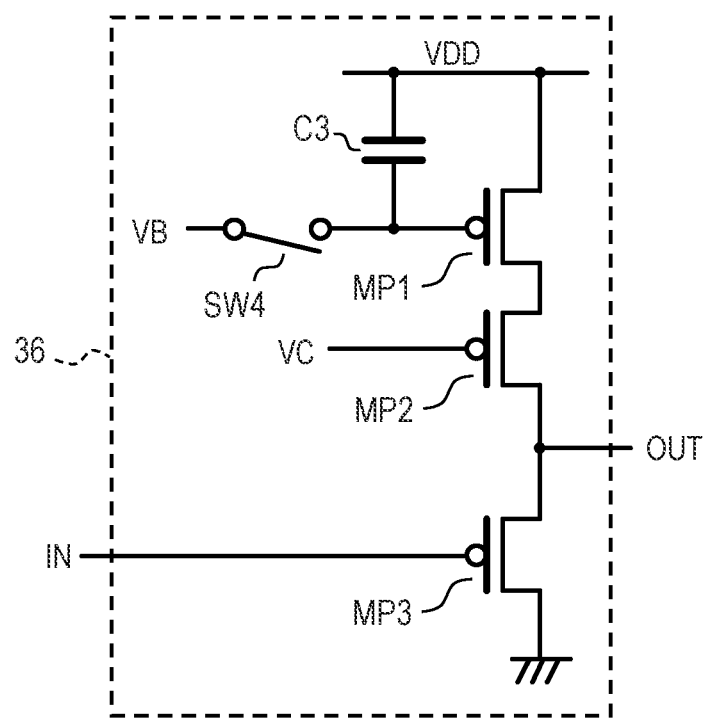
FIG. 4 is a circuit diagram illustrating a configuration example of a buffer circuit in the photoelectric conversion device according to the first embodiment of the present invention.
Figure 5A:
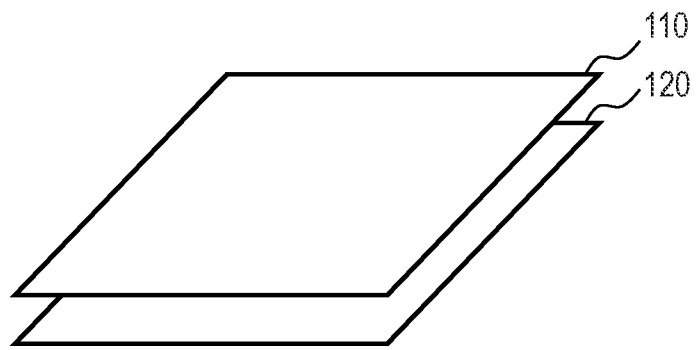
FIG. 5A and FIG. 5B are schematic diagrams illustrating a configuration example of the photoelectric conversion device according to the first embodiment of the present invention.
Figure 5B:
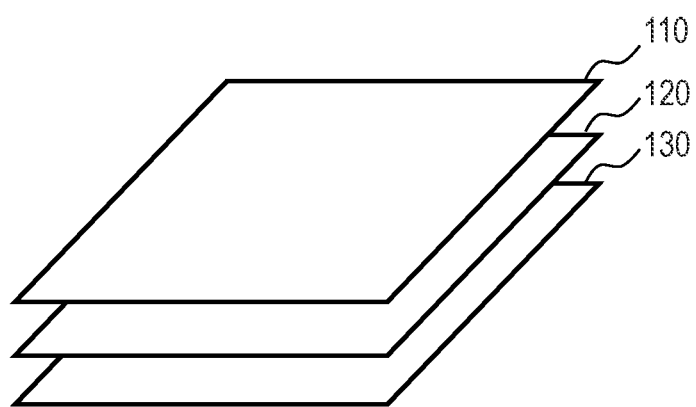
Figure 6:
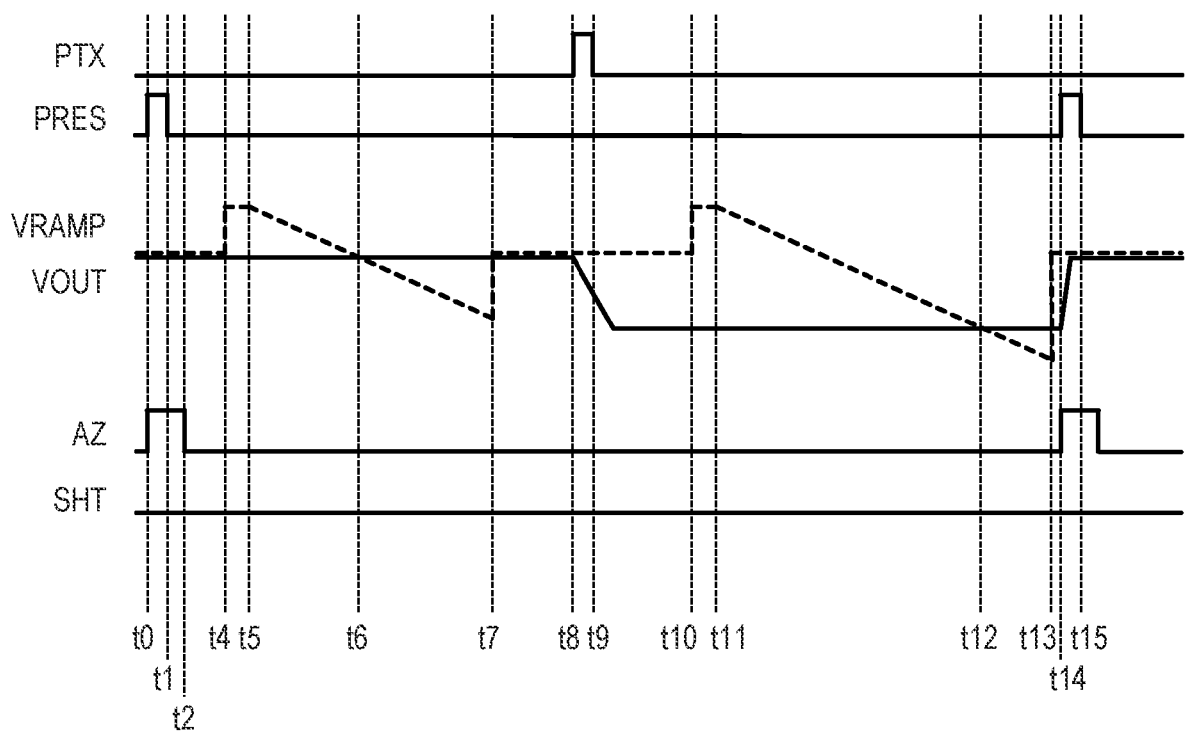
FIG. 6 and FIG. 7 are timing charts illustrating a method of driving the photoelectric conversion device according to the first embodiment of the present invention.
Figure 7:
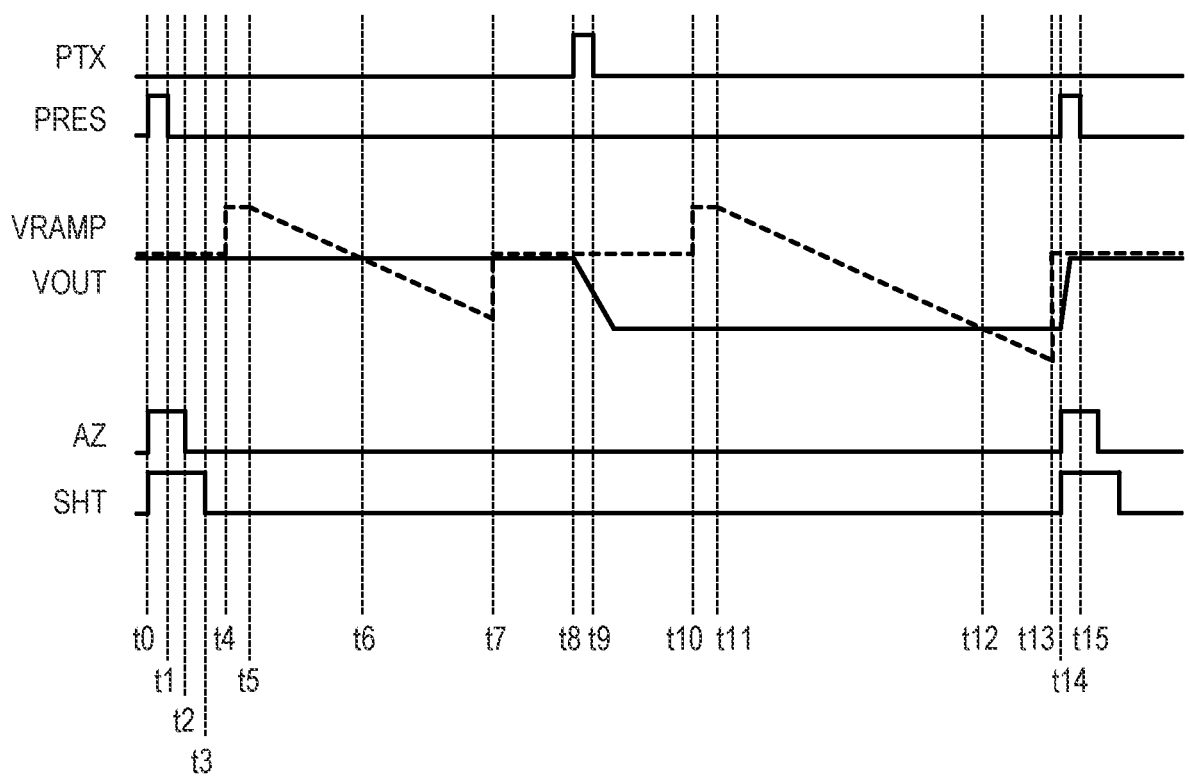

A photoelectric conversion device and a method of driving the same according to a first embodiment of the present invention will be described with reference to FIG. 1 to FIG. 7. FIG. 1 is a block diagram illustrating a schematic configuration of a photoelectric conversion device according to the present embodiment. FIG. 2 is a circuit diagram illustrating a configuration example of a pixel in the photoelectric conversion device according to the present embodiment. FIG. 3 is a circuit diagram illustrating a configuration example of a column circuit in the photoelectric conversion device according to the present embodiment. FIG. 4 is a circuit diagram illustrating a configuration example of a buffer circuit in the photoelectric conversion device according to the present embodiment. FIG. 5A and FIG. 5B are schematic diagrams illustrating a configuration example of the photoelectric conversion device according to the present embodiment. FIG. 6 and FIG. 7 are timing charts illustrating a method of driving the photoelectric conversion device according to the present embodiment.

First, the structure of the photoelectric conversion device according to the present embodiment will be described with reference to FIG. 1 to FIG. 4.

As illustrated in FIG. 1, the photoelectric conversion device 100 according to the present embodiment includes a pixel array unit 10, a vertical scanning circuit 20, readout circuits 30A and 30B, reference signal generation circuits 38A and 38B, and counter circuits 48A and 48B. The photoelectric conversion device 100 further includes horizontal scanning circuits 60A and 60B, output circuits 70A and 70B, and a control circuit 80.

The pixel array unit 10 includes a plurality of pixels 12 arranged over a plurality of rows and a plurality of columns to form a matrix. Each pixel 12 includes a photoelectric converter including a photoelectric conversion element such as a photodiode, and outputs a pixel signal corresponding to an amount of incident light. The number of rows and columns of the pixel array arranged in the pixel array unit 10 is not particularly limited. In addition, in the pixel array unit 10, in addition to effective pixels which output pixel signals according to the amount of incident light, optical black pixels in which the photoelectric converter is shielded from light, dummy pixels which do not output signals, and the like may be arranged.

In each row of the pixel array unit 10, a control line 14 is arranged so as to extend in the first direction (lateral direction in FIG. 1). Each of the control lines 14 is connected to each of the pixels 12 arranged on the corresponding row in the first direction, and serves as a common signal line for these pixels 12. The first direction in which the control lines 14 extend may be referred to as a row direction or a horizontal direction. The control line 14 is connected to the vertical scanning circuit 20.

In each column of the pixel array unit 10, a vertical output line 16A or a vertical output line 16B is arranged so as to extend in a second direction (vertical direction in FIG. 1) intersecting with the first direction. The vertical output lines 16A and the vertical output lines 16B are alternately arranged in each column. For example, the vertical output lines 16A are arranged in odd-numbered columns, and the vertical output lines 16B are arranged in even-numbered columns. Each of the vertical output lines 16A and 16B is connected to each of the pixels 12 arranged on the corresponding column in the second direction, and serves as a common signal lines for these pixels 12. The second direction in which the vertical output lines 16A and 16B extend may be referred to as a column direction or a vertical direction. The vertical output lines 16A are connected to the readout circuit 30A. The vertical output lines 16B are connected to the readout circuit 30B.

The vertical scanning circuit 20 is a control circuit having a function of receiving a control signal output from the control circuit 80, generating a control signal for driving the pixels 12, and supplying the control signal to the pixels 12 via the control line 14. A logic circuit such as a shift register or an address decoder may be used for the vertical scanning circuit 20. The vertical scanning circuit 20 sequentially supplies control signals to the control lines 14 of each row, and sequentially drives the pixels 12 of the pixel array unit 10 on a row basis. A signal read out from the pixel 12 on a row basis is input to the readout circuit 30A or the readout circuit 30B via the vertical output line 16A or the vertical output line 16B provided in each column of the pixel array unit 10.

The readout circuit 30A includes a plurality of column circuits 32 corresponding to the number of columns where the vertical output lines 16A are arranged. Each of the column circuits 32 of the readout circuit 30A is connected to the vertical output line 16A of the corresponding column. The readout circuit 30B includes a plurality of column circuits 32 corresponding to the number of columns where the vertical output lines 16B are arranged. Each of the column circuits 32 of the readout circuit 30B is connected to the vertical output line 16B of the corresponding column. Each of the column circuits 32 is a processing circuit that performs predetermined signal processing such as amplification processing, analog-to-digital conversion (AD conversion) processing and the like on the pixel signal read out from the pixel 12 on the corresponding column. The column circuit 32 may include a signal holding circuit (memory) for holding the processed pixel signal.

The reference signal generation circuit 38A is connected to the readout circuit 30A. The reference signal generation circuit 38A has a function of receiving a control signal output from the control circuit 80, generating a reference signal for use in the AD conversion, and supplying the reference signal to the readout circuit 30A. Similarly, the reference signal generation circuit 38B is connected to the readout circuit 30B. The reference signal generation circuit 38B has a function of receiving a control signal output from the control circuit 80, generating a reference signal for use in the AD conversion, and supplying the reference signal to the readout circuit 30B.

The reference signal for use in the AD conversion may be a signal having a predetermined amplitude corresponding to a range of the pixel signal and whose signal level changes with lapse of time. The reference signal is not particularly limited, but, for example, a ramp signal whose signal level monotonically increases or monotonically decreases with lapse of time may be applied. It is to be noted that the change of the signal level is not necessarily continuous, and may be in a step shape. The change in the signal level need not necessarily be linear with respect to time, but may be curvilinear with respect to time (e.g., sine wave or cosine wave).

The counter circuit 48A is connected to the readout circuit 30A. The counter circuit 48A performs a counting operation in accordance with a control signal output from the control circuit 80, and outputs a count signal indicating the count value to the readout circuit 30A. The counter circuit 48A starts a counting operation in synchronization with a timing at which a change in the signal level of the reference signal supplied from the reference signal generation circuit 38A starts. Similarly, the counter circuit 48B is connected to the readout circuit 30B. The counter circuit 48B has a function of performing a counting operation in accordance with a control signal output from the control circuit 80 and outputting a count signal indicating the count value to the readout circuit 30B. The counter circuit 48B starts a counting operation in synchronization with a timing at which a change in the signal level of the reference signal supplied from the reference signal generation circuit 38B starts.

The horizontal scanning circuit 60A is a control circuit having a function of receiving a control signal output from the control circuit 80, generating a control signal for reading out a pixel signal from the column circuit 32 of the readout circuit 30A, and supplying the control signal to the readout circuit 30A. The horizontal scanning circuit 60A sequentially scans the column circuits 32 of the readout circuit 30A, and sequentially outputs the pixel signals held in the column circuits 32 to the output circuit 70A via the horizontal output line 62A. Similarly, the horizontal scanning circuit 60B is a control unit having a function of receiving a control signal output from the control circuit 80, generating a control signal for reading out a pixel signal from the column circuit 32 of the readout circuit 30B, and supplying the control signal to the readout circuit 30B. The horizontal scanning circuit 60B sequentially scans the column circuits 32 of the readout circuit 30B, and sequentially outputs the pixel signals held in the column circuits 32 to the output circuit 70B via the horizontal output line 62B. A logic circuit such as a shift register or an address decoder may be used for the horizontal scanning circuits 60A and 60B.

The output circuit 70A is a processing circuit that is configured by a buffer amplifier, a differential amplifier, or the like, performs predetermined signal processing on the pixel signal of the column selected by the horizontal scanning circuit 60A, and outputs the processed pixel data. Similarly, the output circuit 70B is a processing circuit that is configured by a buffer amplifier, a differential amplifier, or the like, performs predetermined signal processing on the pixel signal of the column selected by the horizontal scanning circuit 60B, and outputs the processed pixel data. Examples of the signal processing performed by the output circuits 70A and 70B include correction processing by correlated double sampling (CDS), amplification processing, and the like.

The control circuit 80 is a control circuit for generating control signals for controlling operations of the vertical scanning circuit 20, the readout circuits 30A and 30B, the reference signal generation circuits 38A and 38B, the counter circuits 48A and 48B, and the horizontal scanning circuits 60A and 60B, and supplying the control signals to the respective functional blocks. At least a part of the control signals for controlling the operations of the vertical scanning circuit 20, the readout circuits 30A and 30B, the reference signal generation circuits 38A and 38B, the counter circuits 48A and 48B, and the horizontal scanning circuits 60A and 60B may be supplied from the outside of the photoelectric conversion device 100.

FIG. 1 illustrates an example in which two readout circuit blocks, one of which includes a readout circuit 30A, a horizontal scanning circuit 60A, an output circuit 70A and the like, and the other of which includes a readout circuit 30B, a horizontal scanning circuit 60B, an output circuit 70B and the like, are provided. However, the number of readout circuit blocks is not necessarily two, but may be one.

As illustrated in, e.g., FIG. 2, each of the plurality of pixels 12 constituting the pixel array unit 10 may include a photoelectric conversion element PD, a transfer transistor M1, a reset transistor M2, an amplifier transistor M3, and a select transistor M4. Each pixel 12 may further include a microlens and a color filter arranged on an optical path until incident light is guided to the photoelectric conversion element PD. The microlens converges incident light on the photoelectric conversion element PD. The color filter selectively transmits light of a predetermined color.

The photoelectric conversion element PD is, for example, a photodiode, an anode of which is connected to a reference voltage node, and a cathode of which is connected to a source of the transfer transistor M1. A drain of the transfer transistor M1 is connected to a source of the reset transistor M2 and a gate of the amplifier transistor M3. A node FD to which the drain of the transfer transistor M1, the source of the reset transistor M2, and the gate of the amplifier transistor M3 are connected is a so-called floating diffusion. The floating diffusion includes a capacitance component (floating diffusion capacitance) and functions as a charge holding portion. The floating diffusion capacitance may include a p-n junction capacitance and an interconnection capacitance. A drain of the reset transistor M2 and a drain of the amplifier transistor M3 are connected to a node to which a power supply voltage (voltage VDD) is supplied. A source of the amplifier transistor M3 is connected to a drain of the select transistor M4. A source of the select transistor M4 is connected to the vertical output line 16A (or the vertical output line 16B).

In the case of the pixel configuration of FIG. 2, the control line 14 of each row may include three signal lines respectively connected to the gate of the transfer transistor M1, the gate of the reset transistor M2, and the gate of the select transistor M4. A control signal PTX is supplied from the vertical scanning circuit 20 to the gate of the transfer transistor M1. A control signal PRES is supplied from the vertical scanning circuit 20 to the gate of the reset transistor M2. A control signal PSEL is supplied from the vertical scanning circuit 20 to the gate of the select transistor M4. When each transistor is formed of an n-channel MOS transistor, when a high-level control signal is supplied from the vertical scanning circuit 20, the corresponding transistor is turned on. When a low-level control signal is supplied from the vertical scanning circuit 20, the corresponding transistor is turned off.

In the present embodiment, a description will be given assuming a case where electrons are used as signal charge among electron-hole pairs generated in the photoelectric conversion element PD by light incidence. When electrons are used as the signal charge, each transistor included in the pixel 12 may be formed of an n-channel MOS transistor. However, the signal charge is not limited to electrons, and holes may be used as the signal charge. When holes are used as the signal charge, the conductivity type of each transistor is opposite to that described in the present embodiment. In addition, the terms "source" and "drain" of the MOS transistor may vary depending on the conductivity type of the transistor or the target function. Some or all of names of a source and a drain used in the present embodiment are sometimes referred to as reverse names.

The photoelectric conversion element PD converts (photoelectrically converts) an incident light into electric charge of an amount corresponding to an amount of the incident light, and accumulates the generated electric charge. When the transfer transistor M1 is turned on, the charge held in the photoelectric conversion element PD is transferred to the node FD. The charge transferred from the photoelectric conversion element PD is held by the capacitance component of the node FD (floating diffusion capacitance). As a result, the node FD becomes a potential corresponding to an amount of charge transferred from the photoelectric conversion element PD by charge-voltage conversion by the floating diffusion capacitance.

When the select transistor M4 is turned on, the select transistor connects the amplifier transistor M3 to the vertical output line 16A (or the vertical output line 16B). The amplifier transistor M3 is configured such that a voltage VDD is supplied to the drain and a bias current is supplied from a current source (a current source 34 described later) (not illustrated) to the source via the select transistor M4, and constitutes an amplifier unit (source follower circuit) having the gate as an input node. Accordingly, the amplifier transistor M3 outputs a signal based on the voltage of the node FD to the vertical output line 16A (or the vertical output line 16B) via the select transistor M4. In this sense, the amplifier transistor M3 and the select transistor M4 configure an output unit that output a pixel signal corresponding to the amount of charge held in the node FD.

The reset transistor M2 has a function of controlling supply of a voltage (voltage VDD) for resetting the node FD serving as a charge holding unit to the FD node. When the reset transistor M2 is turned on, the reset transistor resets the node FD to a voltage corresponding to the voltage VDD.

As illustrated in, e.g., FIG. 3, each of the plurality of column circuits 32 constituting the readout circuit 30A may include a current source 34, a buffer circuit 36, a comparison circuit 44, memories 52W and 52R, capacitors C1 and C2, and switches SW1, SW2, and SW3.

The vertical output line 16A is connected to the current source 34 and one electrode of the capacitor C1. The current source 34 serves as a load current source of the amplifier transistor M3 of the pixel 12.

The buffer circuit 36 includes an input node and an output node. An input node of the buffer circuit 36 is connected to the reference signal line 40. To the input node of the buffer circuit 36, a reference signal VRAMP is supplied from the reference signal generation circuit 38A via a reference signal line 40. The output node of the buffer circuit 36 is connected to one electrode of the capacitor C2. A connection node between the buffer circuit 36 and the capacitor C2 is connected to a connection node between the buffer circuit 36 and the capacitor C2 of the adjacent column circuit 32 via the switch SW1. The switch SW1 is controlled by a control signal SHT supplied from the control circuit 80 via the SHT signal line 42.

The comparison circuit 44 is configured by, for example, a differential amplifier circuit, and includes a non-inverting input node (+), an inverting input node (−), a non-inverting output node (+), and an inverting output node (−). The inverting input node of the comparison circuit 44 is connected to the other electrode of the capacitor C1. A signal VOUT is supplied from the vertical output line 16A to the inverting input node of the comparison circuit 44 via the capacitor C1. A non-inverting input node of the comparison circuit 44 is connected to the other electrode of the capacitor C2. A non-inverting input node of the comparison circuit 44 is supplied with the reference signal VRAMP from the reference signal line 40 via the buffer circuit 36 and the capacitor C2. The switch SW2 is connected between the inverting input node and the non-inverting output node of the comparison circuit 44. The switch SW3 is connected between the non-inverting input node and the inverting output node of the comparison circuit 44. The switches SW2 and SW3 are controlled by a control signal AZ supplied from the control circuit 80 via the AZ signal line 46. The switches SW2 and SW3 are reset switches for resetting the threshold voltage of the comparison circuit 44.

The comparison circuit 44 compares the level of the signal VOUT supplied from the vertical output line 16A via the capacitor C1 with the level of the reference signal VRAMP supplied from the reference signal line 40 via the buffer circuit 36 and the capacitor C2, and outputs a signal according to the comparison result. For example, the comparison circuit 44 outputs a high-level signal when the level of the reference signal VRAMP is lower than the level of the signal VOUT. The comparison circuit 44 outputs a low-level signal when the level of the reference signal VRAMP is higher than the level of the signal VOUT. The relationship between the magnitude of the input signal and the level of the output signal may be reversed.

The comparison circuit 44 is not limited to the illustrated configuration as long as it has a node to which a pixel signal is input and a node to which a reference signal is input, and may perform an offset clamp operation of setting an offset based on the voltages of the pixel signal and the reference signal.

The memory 52W includes two input nodes and one output node. One input node of the memory 52W is connected to the non-inverting output node of the comparison circuit 44. The other input node of the memory 52W is connected to the count signal line 50. A count signal COUNT is supplied from the counter circuit 48A to the other input node of the memory 52W via the count signal line 50. The memory 52R includes two input nodes and one output node. One input node of the memory 52R is connected to the output node of the memory 52W. The other input node of the memory 52R is connected to the horizontal scanning circuit 60A. The output node of the memory 52R is connected to the horizontal output line 62A.

The memory 52W holds the count value indicated by the count signal COUNT supplied from the counter circuit 48A at the timing when the level of the non-inverting output node of the comparison circuit 44 is inverted, as a digital data of the pixel signal. The memory 52R holds the digital data of pixel signal transferred from the memory 52W. The digital data held in the memory 52R is sequentially transferred to the output circuit 70A via the horizontal output line 62A for each column according to the control signal supplied from the horizontal scanning circuit 60A. By providing the memory 52R after the memory 52W, the AD conversion operation may be performed in parallel with the transfer operation to the output circuit 70A.

Instead of providing the counter circuit 48A, the memory 52W of the column circuit 32 may have a function of a counter circuit. In this case, the memory 52W of the column circuit 32 of each column receives the common clock signal output from the control circuit 80 and counts pulses of the clock signal. The count value at the timing when the level of the output signal of the comparison circuit 44 is inverted becomes the digital data held in the memory 52W.

Since the column circuit 32 of the readout circuit 30B is the same as the column circuit 32 of the readout circuit 30A except that the column circuit 32 of the readout circuit 30B is arranged in the column different from the column in which the column circuit 32 of the readout circuit 30A is arranged, description thereof is omitted. Hereinafter, the column circuit 32 of the readout circuit 30A will be described, but the same applies to the column circuit 32 of the readout circuit 30B.

As illustrated in, e.g., FIG. 4, the buffer circuit 36 includes p-channel transistors MP1, MP2, and MP3, a capacitor C3, and a switch SW4. A source of the p-channel transistor MP1 is connected to a node to which a power supply voltage (voltage VDD) is supplied. A drain of the p-channel transistor MP1 is connected to a source of the p-channel transistor MP2. A drain of the p-channel transistor MP2 is connected to a source of the p-channel transistor MP3. A drain of the p-channel transistor MP3 is connected to a reference voltage node. A bias voltage VB is supplied to a gate of the p-channel transistor MP1 via a switch SW4. A capacitor C3 is connected between the node to which the power supply voltage (voltage VDD) is supplied and the gate of the p-channel transistor MP1. A bias voltage VC is supplied to a gate of the p-channel transistor MP2. A gate of the p-channel transistor MP3 is an input node IN of the buffer circuit 36. A connection node between the drain of the p-channel transistor MP2 and the source of the p-channel transistor MP3 is an output node OUT of the buffer circuit 36.

The p-channel transistor MP1 is configured such that the bias voltage VB is supplied to the gate via the switch SW4 and is operated as a current source. The capacitor C3 is connected between the power supply voltage node and the gate of the p-channel transistor MP1, and the p-channel transistor MP1 may be operated even when the bias voltage VB is sampled and held by the capacitor C3. The p-channel transistor MP2 is configured such that the bias voltage VC is supplied to the gate thereof, and is operated as a cascode transistor. The p-channel transistor MP3 constitutes a source follower together with the p-channel transistor MP1 operating as the current source, buffers a signal (reference signal VRAMP) supplied from the input node IN, and outputs the signal from the output node OUT. That is, the buffer circuit 36 buffers the reference signal VRAMP and outputs it to the comparison circuit 44.

A switch SW1 is provided between the output nodes of the buffer circuits 36 of the adjacent column circuits 32 (see FIG. 3). The plurality of switches SW1 configure a switch circuit that switches the connection state between the output nodes of the buffer circuits 36 of each column. The switch SW1 may be configured to be capable of switching the connection state in accordance with a mode which focuses on the operation of the photoelectric conversion device. In other words, by connecting the output nodes of the buffer circuits 36 of the respective columns to each other, the random noise generated by the buffer circuits 36 may be averaged and the noise may be reduced. On the other hand, when the output nodes of the buffer circuits 36 of the respective columns are connected, interference between the columns may be likely to occur. Therefore, it is possible to set the switch SW1 to ON (connected state, conductive state) in a mode in which low noise is important, and set the switch SW1 to OFF (non-connected state, non-conductive state) in a mode in which low interference is important. As described above, by providing the switch SW1 between the output nodes of the buffer circuits 36 of the respective columns, it is possible to make the photoelectric conversion device more functional.

The photoelectric conversion device 100 according to the present embodiment may have a configuration in which all the circuit blocks described above are arranged on one substrate, or may have a configuration in which the circuit blocks are separately formed on each substrate as a stacked type in which a plurality of substrates are stacked.

FIG. 5A is a schematic diagram illustrating a case where a pixel substrate 110 in which the pixel array unit 10 is disposed and a circuit substrate 120 in which other circuit blocks are disposed are stacked. By disposing the pixel substrate 110 and the circuit substrate 120 on different substrates, the size of the photoelectric conversion device 100 may be reduced without sacrificing the area of the pixel array unit 10.

FIG. 5B is a schematic diagram illustrating a case where the pixel substrate 110 in which the pixel array unit 10 is disposed and the circuit substrates 120 and 130 in which other circuit blocks are disposed are stacked. Also in this case, the size of the photoelectric conversion device 100 may be reduced without sacrificing the area of the pixel array unit 10.

Note that the circuit elements constituting one functional block are not necessarily arranged on the same substrate, and may be arranged on different substrates.

Next, a method of driving the photoelectric conversion device according to the present embodiment will be described with reference to FIG. 6 and FIG. 7. FIG. 6 and FIG. 7 are timing charts illustrating operation examples of the photoelectric conversion device according to the present embodiment.

In the photoelectric conversion device according to the present embodiment, the above-described operation mode may be switched by using the switch SW1, and in addition, variation of the power supply voltage and the reference voltage may be suppressed by dispersing the operation timing of the comparison circuit 44 of each column, thereby improving image quality. In this respect, an operation example of the photoelectric conversion device will be described below. Although the operation of the readout circuit 30A is described here, the operation of the readout circuit 30B is similar.

FIG. 6 is a timing chart illustrating an operation example when the switch SW1 is not driven (the switch SW1 is always in a non-conductive state). In FIG. 6, waveforms of the control signals PTX, PRES, AZ, SHT, and the signal VOUT are indicated by solid lines, and a waveform of the reference signal VRAMP is indicated by a broken line. Here, it is assumed that the corresponding transistor or switch is turned on when the control signal PTX, PRES, AZ, or SHT is at high-level, and the corresponding transistor or switch is turned off when the control signal PTX, PRES, AZ, or SHT is at low-level.

It is assumed that the control signal PSEL (not illustrated) of a row to be read out is high-level immediately before time t0. As a result, the select transistor M4 of each of the pixels 12 belonging to the row is turned on, and each of the pixels 12 may output a pixel signal to the vertical output line 16A of the corresponding column. Immediately before the time t0, the control signals PTX and PRES and the control signals SHT and AZ of the row to be read out are at low-level, and the reference signal VRAMP is a predetermined reference voltage.

During a period from the time t0 to time t1, the vertical scanning circuit 20 controls the control signal PRES of the row to be read out to high-level. Accordingly, the reset transistor M2 of each of the pixels 12 belonging to the row is turned on, and the node FD is reset to a voltage corresponding to the voltage VDD. A signal VOUT (pixel signal of a reset level) having a voltage corresponding to a reset voltage of the node FD is output to the vertical output line 16A.

During a period from the time t0 to time t2, the control circuit 80 controls the control signal AZ to high-level. As a result, the switches SW2 and SW3 of the column circuit 32 of each column are turned on, and the inverted input node and the non-inverted input node of the comparison circuit 44 are reset to a voltage of a reset level. That is, at the time t2, one electrode of the capacitor C1 is at the voltage of the reset level of the signal VOUT, and the other electrode of the capacitor C1 is at the voltage of the reset level of the comparison circuit 44. One electrode of the capacitor C2 is at the reference voltage of the reference signal VRAMP, and the other electrode of the capacitor C2 is at the voltage of the reset level of the comparison circuit 44. A threshold voltage of the comparison circuit 44 is reset to a voltage corresponding to a potential difference between the voltage of the reset level of the signal VOUT and the reference voltage of the reference signal VRAMP.

The threshold voltage of the comparison circuit 44 is a voltage corresponding to a difference between a signal level of the pixel signal and a signal level of the reference signal when a level of a comparison signal output from the comparison circuit 44 changes. That is, the comparison circuit 44 outputs the comparison signals indicating different levels when the difference between the signal level of the pixel signal and the signal level of the reference signal is smaller than the threshold voltage and larger than the threshold voltage.

At the subsequent time t2, the control circuit 80 controls the control signal AZ to low-level. As a result, the switches SW2 and SW3 of the column circuit 32 of each column are turned off, the reset level of the signal VOUT is clamped by the capacitor C1, and the reference level corresponding to the reference voltage of the reference signal VRAMP is clamped by the capacitor C2.

At subsequent time t4, the reference signal generation circuit 38A increases the reference signal VRAMP from the reference voltage to a predetermined start voltage. Then, the reference signal generation circuit 38 starts a slope operation in which the voltage of the reference signal VRAMP changes with lapse of time from subsequent time t5. The counter circuit 48A starts counting up simultaneously with the start of the slope operation, and supplies a count signal COUNT indicating the count value to the column circuit 32 of each column via the count signal line 50.

The comparison circuit 44 performs a comparison operation between the level of the signal VOUT input via the capacitor C1 and the level of the reference signal VRAMP input via the capacitor C2. Then, the comparison circuit 44 inverts the level of the output signal at a timing when the magnitude relationship between the level of the signal VOUT and the level of the reference signal VRAMP changes, for example, at time t6 in FIG. 6. In the comparison operation between the reset level signal VOUT and the reference signal VRAMP, the levels of the output signals of a large number of comparison circuits 44 may be inverted at the same time. When a plurality of comparison circuits 44 are inverted at the same time, the amount of current flowing temporarily increases, which in turn may cause fluctuations in the power supply voltage and the reference voltage.

The memory 52W holds the count value indicated by the count signal COUNT supplied from the counter circuit 48A at the timing when the level of the output signal of the comparison circuit 44 is inverted, as digital data of the pixel signal. In this manner, an AD conversion on the pixel signal of the reset level is performed. After the digital data held in the memory 52W is transferred to the memory 52R, the digital data is transferred to the output circuit 70A in response to a control signal from the horizontal scanning circuit 60A.

At subsequent time t7, the reference signal generation circuit 38A resets the reference signal VRAMP to the level of the reference voltage.

During a period from subsequent time t8 to time t9, the vertical scanning circuit 20 controls the control signal PTX of the row to be read out to high-level. Thereby, the transfer transistor M1 of each of the pixels 12 belonging to the row is turned on, and the charge accumulated in the photoelectric conversion element PD during the predetermined exposure period is transferred to the node FD. Thereby, the voltage of the node FD decreases according to an amount of charge transferred from the photoelectric conversion element PD, and the voltage of the signal VOUT output to the vertical output line 16A also decreases. A signal VOUT (pixel signal of a photo signal level) having a voltage corresponding to the voltage of the node FD is output to the vertical output line 16A.

At subsequent time t10, the reference signal generation circuit 38A increases the reference signal VRAMP from the reference voltage to the predetermined start voltage. Then, the reference signal generation circuit 38 starts a slope operation in which the voltage of the reference signal VRAMP changes with lapse of time from subsequent time t11. The counter circuit 48A starts counting up simultaneously with the start of the slope operation, and supplies the count signal COUNT indicating the count value to the column circuit 32 of each column via the count signal line 50.

The comparison circuit 44 performs a comparison operation between the level of the signal VOUT input via the capacitor C1 and the level of the reference signal VRAMP input via the capacitor C2. Then, the comparison circuit 44 inverts the level of the output signal at a timing when the magnitude relationship between the level of the signal VOUT and the level of the reference signal VRAMP changes, for example, at time t12 in FIG. 6.

The memory 52W holds the count value indicated by the count signal COUNT supplied from the counter circuit 48A at the timing when the level of the output signal of the comparison circuit 44 is inverted, as digital data of the pixel signal. In this manner, AD conversion on the pixel signal of the photo signal level is performed. After the digital data held in the memory 52W is transferred to the memory 52R, the digital data is transferred to the output circuit 70A in response to a control signal from the horizontal scanning circuit 60A.

The digital data of the pixel signal acquired in this manner is subjected to a correction processing by correlated double sampling in the output circuit 70A of the subsequent stage. In the correction processing by correlated double sampling, the digital data of the pixel signal of the reset level is subtracted from the digital data of the pixel signal of the photo signal level, and the noise component superimposed on the pixel signal of the photo signal level is removed.

FIG. 7 is a timing chart illustrating an operation example when the switch SW1 is driven. In FIG. 7, the waveforms of the control signals PTX, PRES, AZ, SHT, and the signal VOUT are indicated by solid lines, and the waveform of the reference signal VRAMP is indicated by a broken line. Here, it is assumed that the corresponding transistor or switch is turned on when the control signal PTX, PRES, AZ, or SHT is at high-level, and the corresponding transistor or switch is turned off when the control signals PTX, PRES, AZ, or SHT is at low-level.

The timing chart of FIG. 7 is different from the timing chart of FIG. 6 in that the control signal SHT is controlled to high-level during a period from time t0 to time t3. By controlling the control signal SHT to high-level, the switch SW1 is turned on, and the output nodes of the buffer circuits 36 of the respective columns are electrically connected to each other. That is, the reset of the comparison circuit 44, and the clamp of the reset level of the signal VOUT and the reference level of the reference signal VRAMP are performed in a state where the output nodes of the buffer circuits 36 of the respective columns are connected to each other, and then the connection between the output nodes of the buffer circuits 36 of the respective columns is released.

In general, the buffer circuit 36 has a unique offset due to variation in performance of each element, variation in inter-connection resistance, and the like, and the output of the buffer circuit 36 of each column includes a unique offset component. During the period from the time t0 to the time t2, since the output nodes of the buffer circuits 36 of the respective columns are electrically connected by turning on the switch SW1, an average value of the offsets of the buffer circuits 36 appears at the output of the buffer circuit 36 of the respective columns. On the other hand, when the connection between the output nodes of the buffer circuits 36 of the respective columns is released at the time t3, an offset unique to each of the buffer circuits 36 of the respective columns appears on the output node of the corresponding buffer circuit 36. As a result, the inversion timing of the output signal of the comparison circuit 44 deviates from the time t6 by a change from the average value of the offset to each offset. Thus, the inversion timings of the output signals of the comparison circuits 44 in the column circuits 32 of the respective columns may be dispersed, and the number of comparison circuits 44 in which the output signals are inverted temporarily may be reduced. As a result, the amount of peak current may be reduced, and consequently variations in the power supply voltage and the reference voltage may be suppressed. The deviation of the count values due to the deviation of the inversion timings of the output signals of the comparison circuits 44 of each column may be removed as an offset component by performing the digital CDS processing in the output circuit 70A.

The operation mode of the switch SW1 may be switched according to the gain, for example, the control signal SHT may be always operated at low-level in the case where the inclination of the reference signal VRAMP is reduced to increase the AD conversion gain. Further, in FIG. 7, after the control signal AZ is set to low-level at the time t2, the control signal SHT is set to low-level at the time t3, but the control signal AZ and the control signal SHT may be set to low-level at the same time. Alternatively, the control signal SHT may be set to low-level immediately before the control signal AZ is set to low-level at the time t2. Further, the timing of setting the control signal SHT to low-level may be adjusted in accordance with the inclination of the reference signal VRAMP. At least a period during which the control signal AZ is at high-level and a period during which the control signal SHT is at high-level may overlap. In other words, the control signal SHT only needs to be at high-level during at least a part of the period in which the control signal AZ is at high-level. That is, it is sufficient that the switch SW1 is turned on in at least a part of the period in which the switches SW2 and SW3 are turned on. In this way, by turning on the switch SW1 during at least a part of the period during which the offset clamp operation is performed, the average value of the offsets of the plurality of the buffer circuits 36 may be acquired, and the noise may be reduced.

As described above, according to the present embodiment, in the photoelectric conversion device including the column-parallel AD converter, it is possible to realize multi-function, suppress variation in the power supply voltage, and improve the image quality.

Second Embodiment

Figure 8:
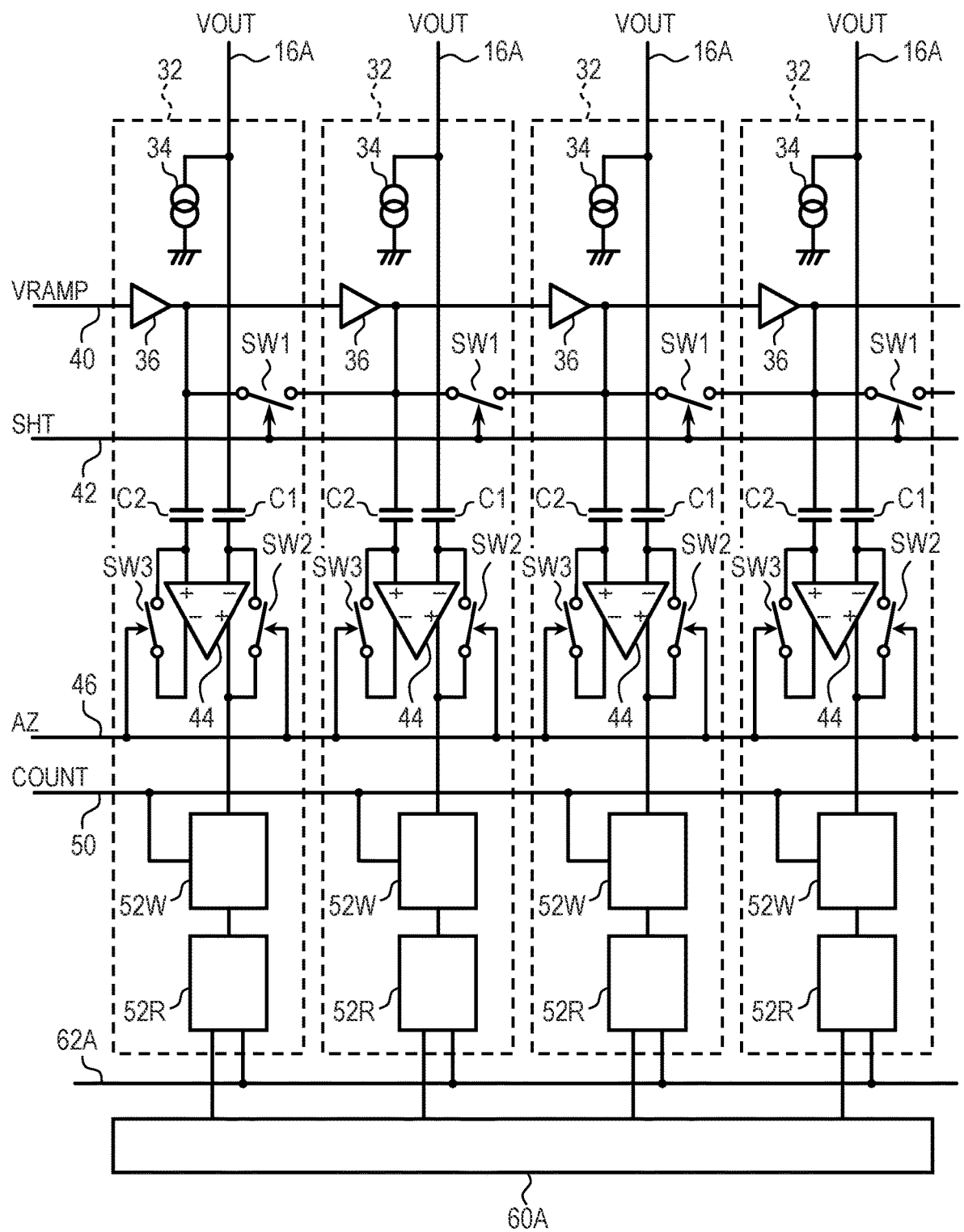
FIG. 8 is a circuit diagram illustrating a configuration example of a column circuit in a photoelectric conversion device according to a second embodiment of the present invention.

A photoelectric conversion device according to a second embodiment of the present invention will be described with reference to FIG. 8. Components similar to those of the photoelectric conversion device according to the first embodiment are denoted by the same reference numerals, and description thereof will be omitted or simplified. FIG. 8 is a circuit diagram illustrating a configuration example of a column circuit in the photoelectric conversion device according to the present embodiment.

The photoelectric conversion device according to the present embodiment is the same as the photoelectric conversion device according to the first embodiment except that the configuration of the column circuit 32 is different. In the present embodiment, the column circuit 32 of the present embodiment will be mainly described with respect to portions different from the column circuit 32 of the first embodiment, and a description of portions common to the photoelectric conversion device of the first embodiment will be appropriately omitted.

In the photoelectric conversion device according to the first embodiment, the buffer circuit 36 of the column circuit 32 of each column is connected in parallel to the reference signal line 40 (see FIG. 3). On the other hand, in the photoelectric conversion device according to the present embodiment, as illustrated in FIG. 8, a plurality of buffer circuits 36 are connected in series to a path through which the reference signal is supplied. The capacitor C2 of the column circuit 32 of each column is connected to the reference signal line 40 at a node between the buffer circuits 36 of the adjacent column circuits 32. Similar to the first embodiment, the output nodes of the buffer circuits 36 of the adjacent column circuits 32 are connected via the switch SW1.

Even when the column circuit 32 is configured in this manner, the influence of random noise generated by the buffer circuit 36 may be reduced by turning on the switch SW1. In other words, a mode that operates with low noise may be implemented. In addition, by performing the driving similar to that in the timing diagram of FIG. 7, the inversion timings of the output signals of the comparison circuits 44 in the column circuit 32 of the respective columns may be dispersed to suppress variation in the power supply voltage and the reference voltage, whereby image quality may be improved. That is, by turning on the switch SW1 during the clamp period from the time t0 to the time t2, the offset of the buffer circuit 36 of each column may be averaged. By setting the control signal SHT to low-level after the clamp is finished, the inversion timings of the comparison circuits 44 in the column circuits 32 of the respective columns may be dispersed.

In the photoelectric conversion device according to the first embodiment, since the buffer circuit 36 is connected in parallel between the reference signal line 40 and the comparison circuit 44 of each column, the buffer circuit 36 between the reference signal generation circuit 38A and the comparison circuit 44 of each column is unified. Therefore, the photoelectric conversion device according to the first embodiment has an advantage in that the characteristics of each column may be easily made uniform as compared with the photoelectric conversion device according to the present embodiment.

As described above, according to the present embodiment, in the photoelectric conversion device including the column-parallel AD converter, it is possible to realize multifunction, suppress variation in the power supply voltage, and improve the image quality.

Third Embodiment

Figure 9:
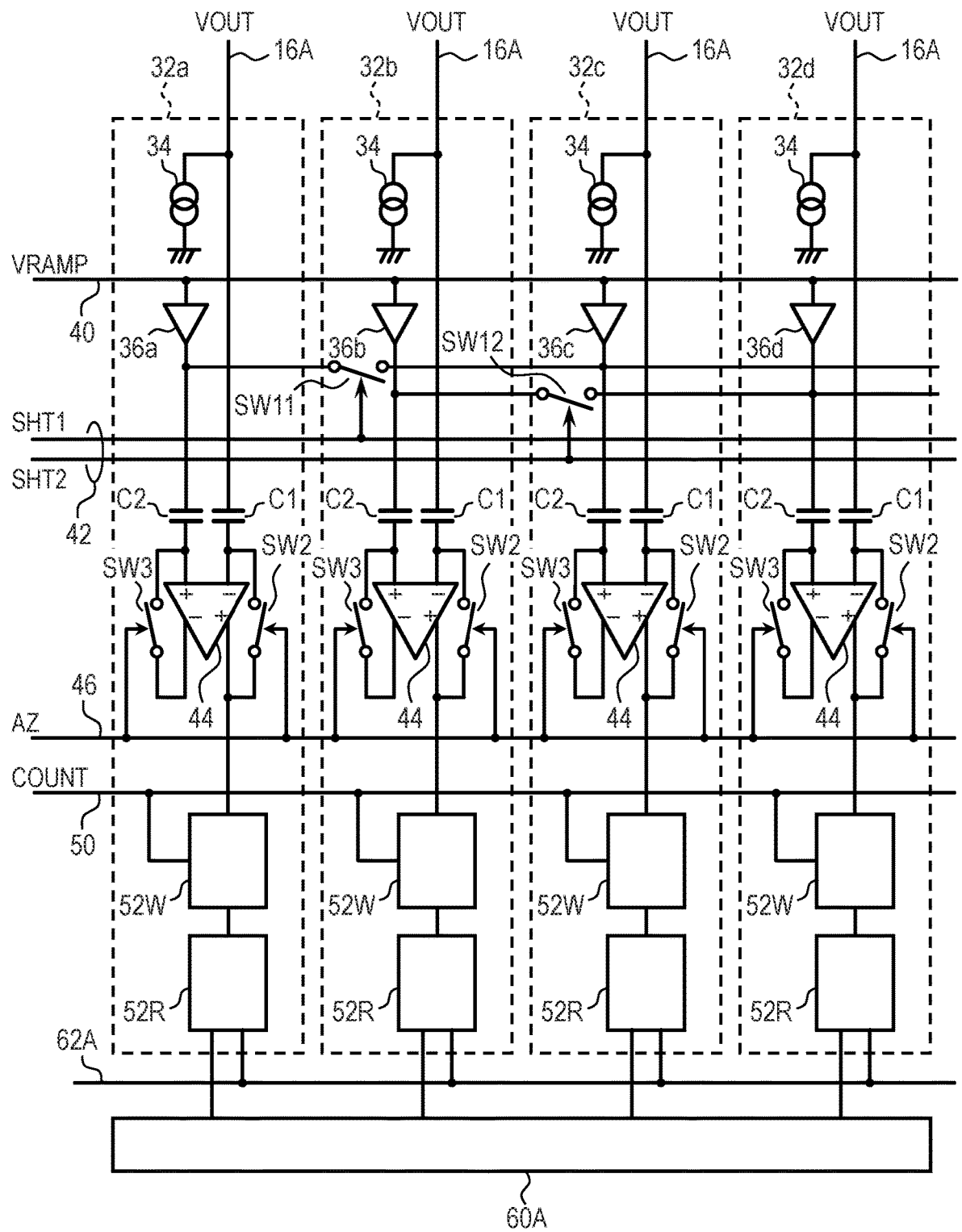
FIG. 9 is a circuit diagram illustrating a configuration example of a column circuit in a photoelectric conversion device according to a third embodiment of the present invention.

A photoelectric conversion device according to a third embodiment of the present invention will be described with reference to FIG. 9. Components similar to those of the photoelectric conversion device according to the first or second embodiment are denoted by the same reference numerals, and description thereof will be omitted or simplified. FIG. 9 is a circuit diagram illustrating a configuration example of a column circuit in the photoelectric conversion device according to the present embodiment.

The photoelectric conversion device according to the present embodiment is the same as the photoelectric conversion device according to the first embodiment except that the configuration of the column circuit 32 is different. In the present embodiment, the column circuit 32 of the present embodiment will be mainly described with respect to portions different from the column circuit 32 of the first embodiment, and a description of portions common to the photoelectric conversion device of the first embodiment will be appropriately omitted.

In the photoelectric conversion device according to the first embodiment, the switch SW1 is provided between the output nodes of the buffer circuits 36 of the adjacent column circuits 32 (see FIG. 3). On the other hand, in the photoelectric conversion device according to the present embodiment, as illustrated in FIG. 9, the switch SW11 is provided between an output node of a buffer circuit 36a of a column circuit 32a and an output node of a buffer circuit 36c of a column circuit 32c. A switch SW12 is provided between an output node of a buffer circuit 36b of a column circuit 32b and an output node of a buffer circuit 36d of a column circuit 32d. Here, the column circuits 32a, 32b, 32c and 32d are arranged next to each other in this order. The switch SW11 is controlled by a control signal SHT1 supplied via the SHT signal line 42. The switch SW12 is controlled by a control signal SHT2 supplied via the SHT signal line 42.

In other words, in the present embodiment, the plurality of column circuits 32 arranged in the respective columns are divided into a first set including the column circuits 32a and 32c and a second set including the column circuits 32b and 32d. The switch SW11 constitutes a switch circuit configured to be capable of switching the connection state between the output nodes of the first set of the buffer circuits 36. The switch SW12 constitutes a switch circuit configured to be capable of switching the connection state between the output nodes of the second set of the buffer circuits 36 independently of the switch circuit including the switch SW11.

In the photoelectric conversion device according to the present embodiment, by controlling only one of the control signals SHT1 and SHT2 to high-level, it is possible to drive only one of the switches SW11 and SW12 to be turned on. By configuring the photoelectric conversion device in this manner, for example, in the case where the column circuits 32 are thinned out every other column, it is easy to deal with an operation mode in which power saving is performed by turning off, e.g., the buffer circuits 36b and 36d. Since the outputs of the buffer circuits 36b and 36d become floating when the buffer circuits 36b and 36d are powered off, when the switch SW12 is turned on and off and potential variation occurs, it takes a certain time for the potentials to stabilize to generate noise, which may cause degradation of image quality. In such a case, only the control signal SHT1 is driven in the same manner as the control signal SHT in the timing diagram of FIG. 7, and the control signal SHT2 is set to low-level to keep the switch SW12 off, whereby it is possible to suppress the degradation of the image quality in the power saving mode.

The set of column circuits 32 connected by the switch SW11 and the set of column circuits 32 connected by the switch SW12 may be set as appropriate. The number of sets of column circuits 32 connected by the switch SW1 is not necessarily two, and three or more sets may be provided.

As described above, according to the present embodiment, in the photoelectric conversion device including the column-parallel AD converter, it is possible to suppress variation in the power supply voltage and improve the image quality.

Fourth Embodiment

Figure 10:
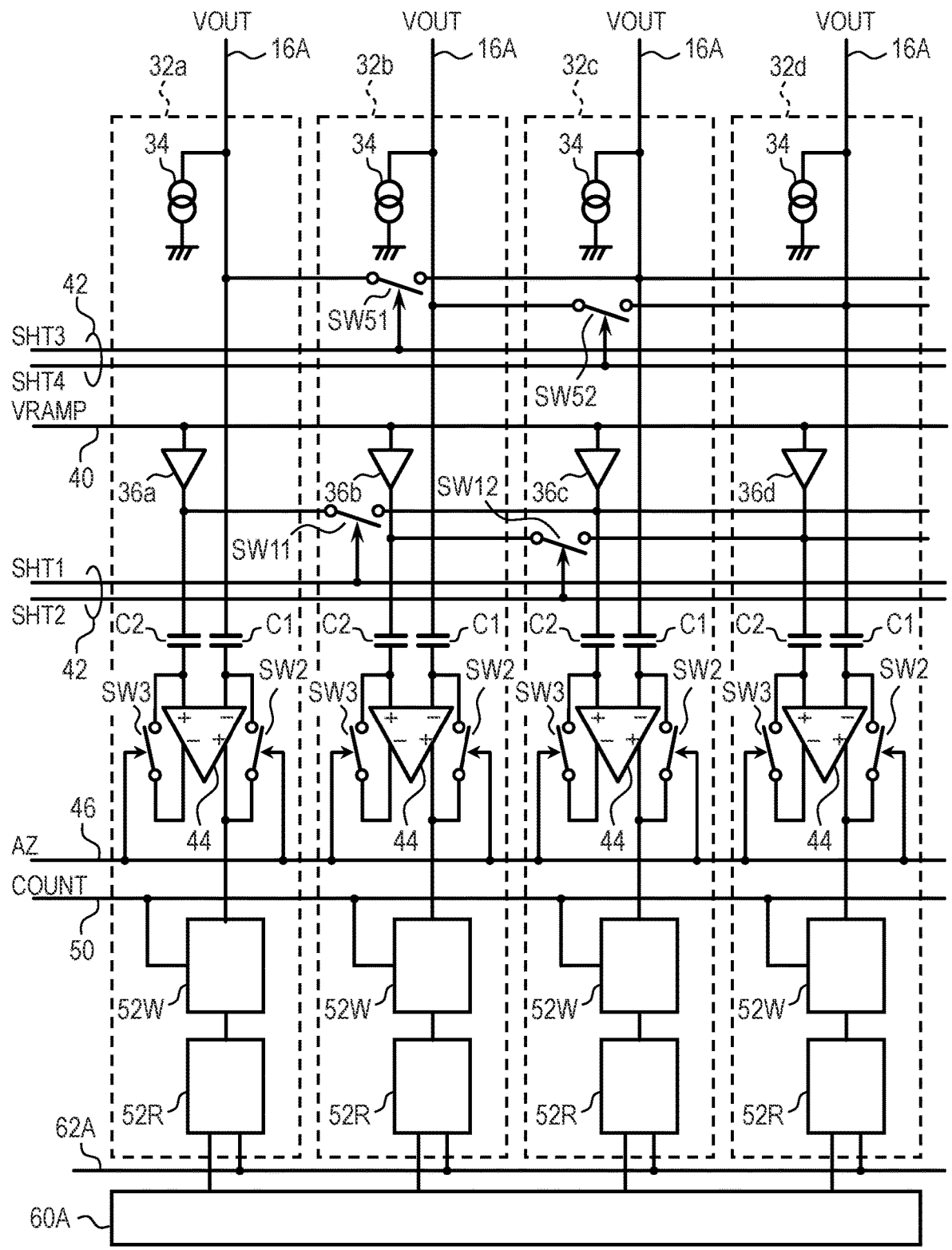
FIG. 10 is a circuit diagram illustrating a configuration example of a column circuit in a photoelectric conversion device according to a fourth embodiment of the present invention.

A photoelectric conversion device according to a fourth embodiment of the present invention will be described with reference to FIG. 10. Components similar to those of the photoelectric conversion devices according to the first to third embodiments are denoted by the same reference numerals, and description thereof will be omitted or simplified. FIG. 10 is a circuit diagram illustrating a configuration example of a column circuit in the photoelectric conversion device according to the present embodiment.

The photoelectric conversion device according to the present embodiment is the same as the photoelectric conversion device according to the third embodiment except that the configuration of the column circuit 32 is different. In the present embodiment, the column circuit 32 of the present embodiment will be mainly described with respect to portions different from the column circuit 32 of the third embodiment, and a description of portions common to the photoelectric conversion device of the third embodiment will be appropriately omitted.

As illustrated in FIG. 10, the photoelectric conversion device according to the present embodiment further includes a switch SW51 provided between a vertical output line 16A connected to the column circuit 32a and a vertical output line 16A connected to the column circuit 32c. The photoelectric conversion device according to the present embodiment further includes a switch SW52 provided between the vertical output line 16A connected to the column circuit 32b and the vertical output line 16A connected to the column circuit 32d. The switch SW51 is controlled by a control signal SHT3 supplied via the SHT signal line 42. The switch SW52 is controlled by a control signal SHT4 supplied via the SHT signal line 42.

The switches SW51 and SW52 form a switch circuit for switching the connection state between the vertical output lines 16A of the respective columns. The switch SW51 constitutes a switch circuit configured to be capable of switching the connection state between the vertical output lines 16A of the columns in which the first set of column circuits 32 including the column circuits 32a and 32c are arranged. The switch SW52 constitutes a switch circuit configured to be capable of switching the connection state between the vertical output lines 16A of the columns in which the second set of column circuits 32 including the column circuits 32b and 32d are arranged.

In the photoelectric conversion device according to the present embodiment, the control signals SHT1, SHT2, SHT3, and SHT4 are controlled in the same manner as the control signals SHT in the timing diagram of FIG. 7. By driving the photoelectric conversion device in this manner, the inversion timings of the output signals of the comparison circuits 44 in the column circuits 32 of the respective columns may be dispersed, and the potential of the vertical output line 16A corresponding to the column circuit 32 of each column may be changed with respect to the clamp period from the time t0 to the time t2. This makes it possible to further suppress variations in the power supply voltage and the reference voltage and improve image quality.

As described above, according to the present embodiment, in the photoelectric conversion device including the column-parallel AD converter, it is possible to suppress variation in the power supply voltage and improve the image quality.

Fifth Embodiment

Figure 11:
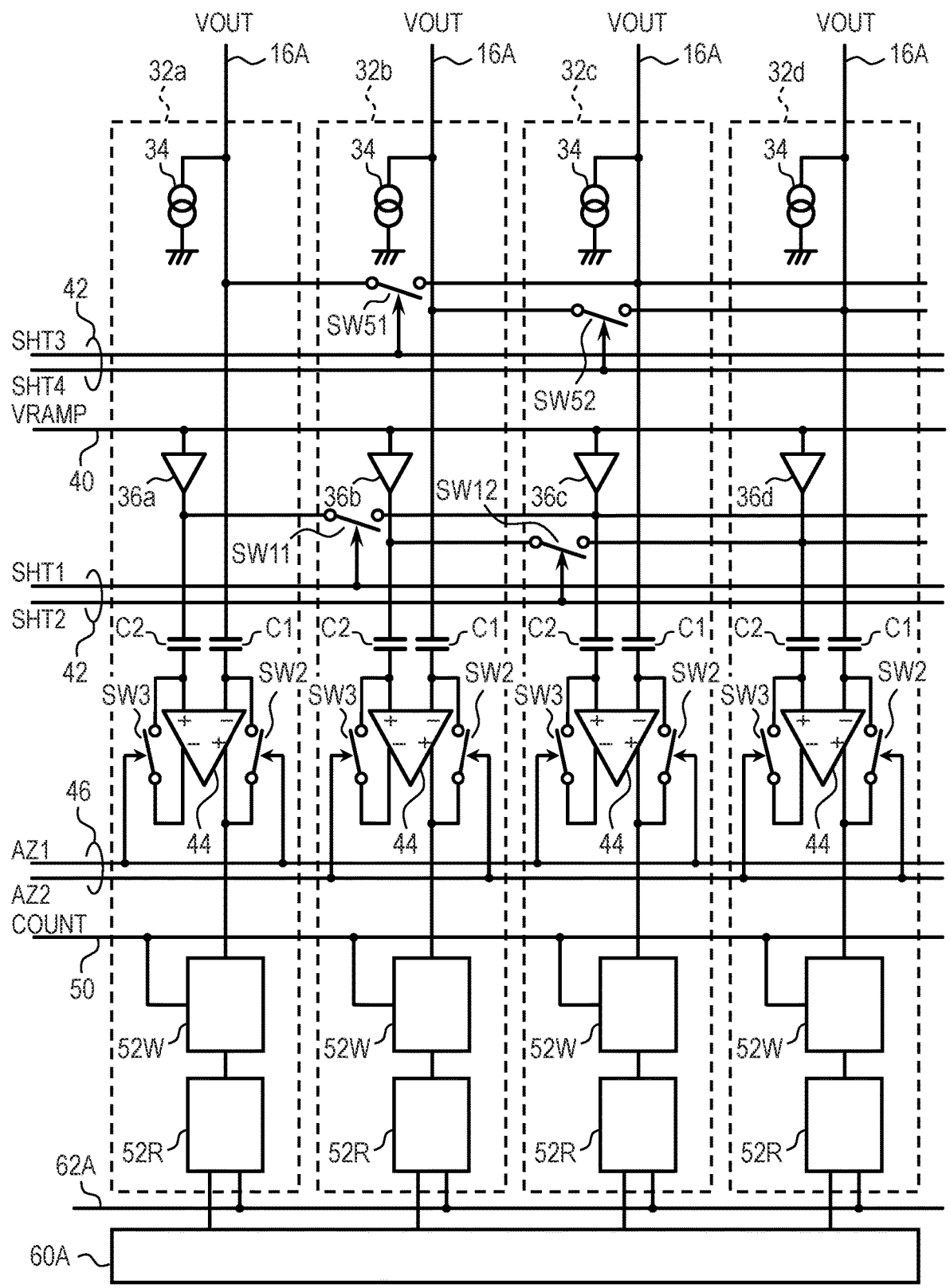
FIG. 11 is a circuit diagram illustrating a configuration example of a column circuit in a photoelectric conversion device according to a fifth embodiment of the present invention.
Figure 12:
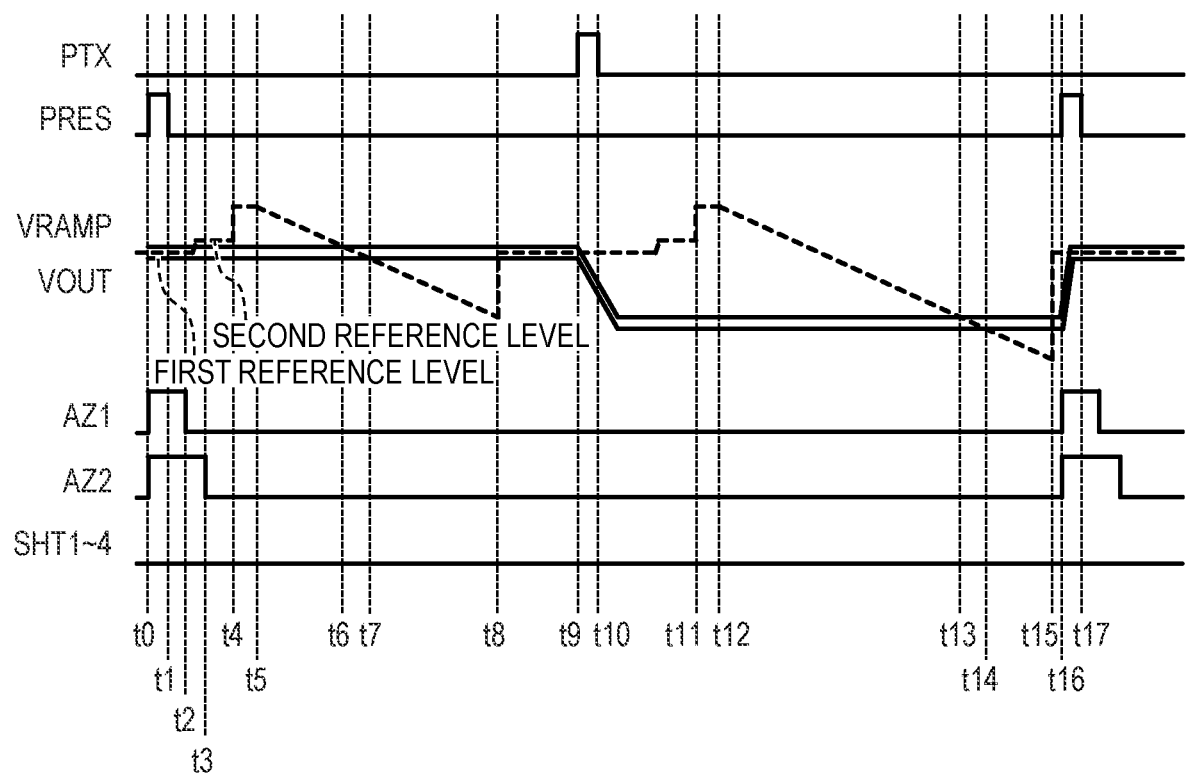
FIG. 12 is a timing chart illustrating a method of driving the photoelectric conversion device according to the fifth embodiment of the present invention.

A photoelectric conversion device according to a fifth embodiment of the present invention will be described with reference to FIG. 11 and FIG. 12. Components similar to those of the photoelectric conversion devices according to the first to fourth embodiments are denoted by the same reference numerals, and description thereof will be omitted or simplified. FIG. 11 is a circuit diagram illustrating a configuration example of a column circuit in the photoelectric conversion device according to the present embodiment. FIG. 12 is a timing chart illustrating a method of driving the photoelectric conversion device according to the present embodiment.

The photoelectric conversion device according to the present embodiment is the same as the photoelectric conversion device according to the fourth embodiment except that the configuration of the column circuit 32 is different. In the present embodiment, the column circuit 32 of the present embodiment will be mainly described with respect to portions different from the column circuit 32 of the fourth embodiment, and a description of portions common to the photoelectric conversion device of the fourth embodiment will be appropriately omitted.

In the photoelectric conversion devices according to the first to fourth embodiments, the switches SW2 and SW3 for resetting the comparison circuit 44 of the column circuit 32 of each column are controlled by the common control signal AZ. On the other hand, in the photoelectric conversion device according to the present embodiment, the reset switches SW2 and SW3 of the comparison circuits 44 of the column circuits 32a and 32c are controlled by the control signal AZ1. The reset switches SW2 and SW3 of the comparison circuits 44 of the column circuits 32b and 32d are controlled by the control signal AZ2.

Next, a method of driving the photoelectric conversion device according to the present embodiment will be described with reference to FIG. 12. FIG. 12 is a timing chart illustrating an operation example when the switches SW11, SW12, SW51, and SW52 are not driven (the switches SW11, SW12, SW51, and SW52 are always in a non-conductive state). In FIG. 12, waveforms of the control signals PTX, PRES, AZ1, AZ2, SHT1, SHT2, SHT3, SHT4 and signal VOUT are indicated by solid lines, and a waveform of the reference signal VRAMP is indicated by a broken line. Here, it is assumed that the corresponding transistor or switch is turned on when the control signals PTX, PRES, AZ1, AZ2, SHT1, SHT2, SHT3 or SHT4 is at high-level. Further, it is assumed that the corresponding transistor or switch is turned off when the control signals PTX, PRES, AZ1, AZ2, SHT1, SHT2, SHT3 or SHT4 is at low-level.

It is assumed that the control signal PSEL (not illustrated) of the row to be read out is high-level immediately before time t0. As a result, the select transistor M4 of each of the pixels 12 belonging to the row is turned on, and each of the pixels 12 may output a pixel signal to the vertical output line 16A of the corresponding column. Immediately before the time t0, the control signals PTX and PRES and the control signals SHT1, SHT2, SHT3, SHT4, AZ1, and AZ2 of the row to be read out are at low-level, and the reference signal VRAMP is a predetermined reference voltage (first reference voltage).

During a period from the time t0 to time t1, the vertical scanning circuit 20 controls the control signal PRES of the row to be read out to high-level. Accordingly, the reset transistor M2 of each of the pixels 12 belonging to the row is turned on, and the node FD is reset to a voltage corresponding to the voltage VDD. A signal VOUT (pixel signal of a reset level) having a voltage corresponding to a reset voltage of the node FD is output to the vertical output line 16A.

During a period from the time t0 to time t2, the control circuit 80 controls the control signal AZ1 to high-level. As a result, the switches SW2 and SW3 of the column circuits 32a and 32c are turned on, and the inverting input nodes and the non-inverting input nodes of the comparison circuits 44 are reset to a voltage of a reset level. That is, at the time t2, one electrode of the capacitor C1 is at the voltage of the reset level of the signal VOUT, and the other electrode of the capacitor C1 is at the voltage of the reset level of the comparison circuit 44. One electrode of the capacitor C2 is at the first reference voltage of the reference signal VRAMP, and the other electrode of the capacitor C2 is at the voltage of the reset level of the comparison circuit 44.

At the time t2, the control circuit 80 controls the control signal AZ1 to low-level. As a result, the switches SW2 and SW3 of the column circuits 32a and 32c are turned off, the reset level of the signal VOUT is clamped by the capacitors C1 of the column circuits 32a and 32c, and the first reference level corresponding to the first reference voltage of the reference signal VRAMP is clamped by the capacitors C2 of the column circuits 32a and 32c.

During a period from the time t2 to time t3, the reference signal generation circuit 38A switches the reference signal VRAMP from the first reference voltage to a predetermined reference voltage (second reference voltage) different from the first reference voltage.

During a period from the time t0 to the time t3, the control circuit 80 controls the control signal AZ2 to high-level. As a result, the switches SW2 and SW3 of the column circuits 32b and 32d are turned on, and the inverting input nodes and the non-inverting input nodes of the comparison circuits 44 are reset to the voltage of the reset level. That is, at the time t3, one electrode of the capacitor C1 is at the voltage of the reset level of the signal VOUT, and the other electrode of the capacitor C1 is at the voltage of the reset level of the comparison circuit 44. One electrode of the capacitor C2 is the second reference voltage of the reference signal VRAMP, and the other electrode of the capacitor C2 is the voltage of the reset level of the comparison circuit 44.

At the time t3, the control circuit 80 controls the control signal AZ2 to low-level. As a result, the switches SW2 and SW3 of the column circuits 32b and 32d are turned off, the reset level of the signal VOUT is clamped by the capacitors C1 of the column circuits 32b and 32d, and the second reference level corresponding to the second reference voltage of the reference signal VRAMP is clamped by the capacitors C2 of the column circuits 32b and 32d.

Thus, the reference signal VRAMP has a first reference level at the time t2 and a second reference level at the time t3, and the comparison circuits 44 of the column circuits 32a and 32c and the comparison circuits 44 of the column circuits 32b and 32d clamp different reference levels of the reference signal VRAMP. Thus, the comparison circuits 44 of the column circuits 32a and 32c and the comparison circuits 44 of the column circuits 32b and 32d invert the level of the output signals at different times with the signal VOUT of the same level. For example, the outputs of the comparison circuits 44 of the column circuits 32a and 32c are inverted at time t6, and the outputs of the comparison circuits 44 of the column circuits 32b and 32d are inverted at time t7. Thus, the timing at which the outputs of the comparison circuits 44 of the column circuits 32a and 32c are inverted and the timing at which the outputs of the comparison circuits 44 of the column circuits 32b and 32d are inverted may be dispersed, and variations in the power supply voltage and the reference voltage may be suppressed, thereby improving image quality.

Although the operation example in which the switches SW11, SW12, SW51, and SW52 are not driven is described here, similar to the third or fourth embodiment, the switches SW11, SW12, SW51, and SW52 may be driven in combination. In this case, for example, as illustrated in FIG. 11, the switch SW11 is provided corresponding to the column circuits 32a and 32c using the control signal AZ1, and the switch SW12 is provided corresponding to the column circuits 32b and 32d using the control signal AZ2. With this configuration, the timing at which the outputs of the comparison circuits 44 of the column circuits 32a and 32c are inverted and the timing at which the outputs of the comparison circuits 44 of the column circuits 32b and 32d are inverted may be further dispersed, and variations in the power supply voltage and the reference voltage may be suppressed more effectively.

As described above, according to the present embodiment, in the photoelectric conversion device including the column-parallel AD converter, it is possible to suppress variation in the power supply voltage and improve the image quality.

Sixth Embodiment

Figure 13:
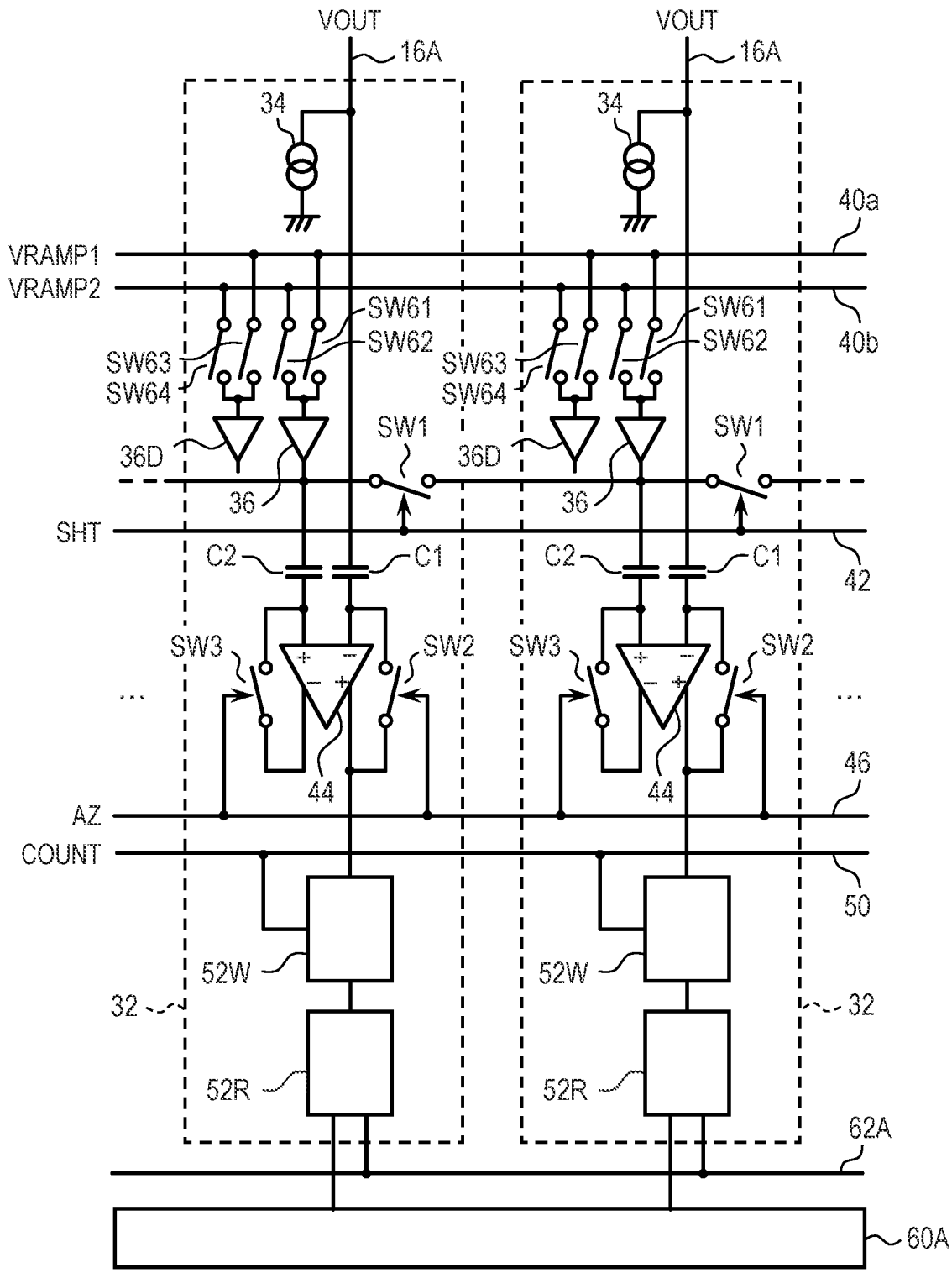
FIG. 13 is a circuit diagram illustrating a configuration example of a column circuit in a photoelectric conversion device according to a sixth embodiment of the present invention.

A photoelectric conversion device according to a sixth embodiment of the present invention will be described with reference to FIG. 13. Components similar to those of the photoelectric conversion devices according to the first to fifth embodiments are denoted by the same reference numerals, and description thereof will be omitted or simplified. FIG. 13 is a circuit diagram illustrating a configuration example of a column circuit in the photoelectric conversion device according to the present embodiment.

In the first to fifth embodiments, the configuration has been described in which one type of reference signal VRAMP is supplied from the reference signal generation circuit 38A to the column circuit 32 of each column, types of the reference signal VRAMP supplied to the column circuit 32 of each column may be two or more. In the present embodiment, as an example, a configuration example in a case where two kinds of reference signals VRAMP are supplied from the reference signal generation circuit 38A via different reference signal lines will be described.

The photoelectric conversion device according to the present embodiment is the same as the photoelectric conversion device according to the first embodiment except that the configuration of the column circuit 32 is different. In the present embodiment, the column circuit 32 of the present embodiment will be mainly described with respect to portions different from the column circuit 32 of the first embodiment, and a description of portions common to the photoelectric conversion device of the first embodiment will be appropriately omitted.

As illustrated in FIG. 13, the column circuit 32 of the photoelectric conversion device according to the present embodiment further includes a dummy buffer circuit 36D and switches SW61, SW62, SW63, and SW64. Further, from the reference signal generation circuit 38A to the column circuits 32 of the respective columns, the reference signal VRAMP1 is supplied via the reference signal line 40a, and the reference signal VRAMP2 is supplied via the reference signal line 40b. One node of the switch SW61 and one node of the switch SW63 are connected to the reference signal line 40a. One node of the switch SW62 and one node of the switch SW64 are connected to the reference signal line 40b. The other node of the switch SW61 and the other node of the switch SW62 are connected to the input node of the buffer circuit 36. The other node of the switch SW63 and the other node of the switch SW64 are connected to an input node of the dummy buffer circuit 36D. The output node of the dummy buffer circuit 36D is in an open state.

By configuring the column circuit 32 of each column in this manner, one of the two kinds of reference signals VRAMP1 and VRAMP2 may be selected as a reference signal input to the comparison circuit 44. That is, by setting the switch SW61 to an on-state and the switch SW62 to an off-state, the reference signal VRAMP1 is input to the comparison circuit 44. When the switch SW61 is set to the off-state and the switch SW62 is set to the on-state, the reference signal VRAMP2 is input to the comparison circuit 44.

The switches SW63 and SW64 are driven complementary to the switches SW61 and SW62. That is, when the switch SW61 is turned on and the switch SW62 is turned off to select the reference signal VRAMP1, the switch SW63 is turned off and the switch SW64 is turned on. In this case, the reference signal line 40a is connected to the buffer circuit 36, and the reference signal line 40b is connected to the dummy buffer circuit 36D. On the other hand, when the switch SW61 is turned off and the switch SW62 is turned on to select the reference signal VRAMP2, the switch SW63 is turned on and the switch SW64 is turned off. In this case, the reference signal line 40a is connected to the dummy buffer circuit 36D, and the reference signal line 40b is connected to the buffer circuit 36. In other words, even when one of the reference signals VRAMP1 and VRAMP2 is selected as the reference signal input to the comparison circuit 44, either the buffer circuit 36 or the dummy buffer circuit 36D is connected to each of the reference signal lines 40a and 40b. Therefore, by driving the switches SW61, SW62, SW63, and SW64 in this manner, it is possible to suppress variation in capacitance accompanying the reference signal lines 40a and 40b.

Although the switch SW1 is not provided between the output nodes of the dummy buffer circuit 36D from the viewpoint of reducing the area in the configuration example of FIG. 13, the switch SW1 may be provided between the output nodes of the dummy buffer circuit 36D as in the case of the output nodes of the buffer circuit 36.

As described above, according to the present embodiment, in the photoelectric conversion device including the column-parallel AD converter, it is possible to suppress variation in the power supply voltage and improve the image quality.

Seventh Embodiment

Figure 14:
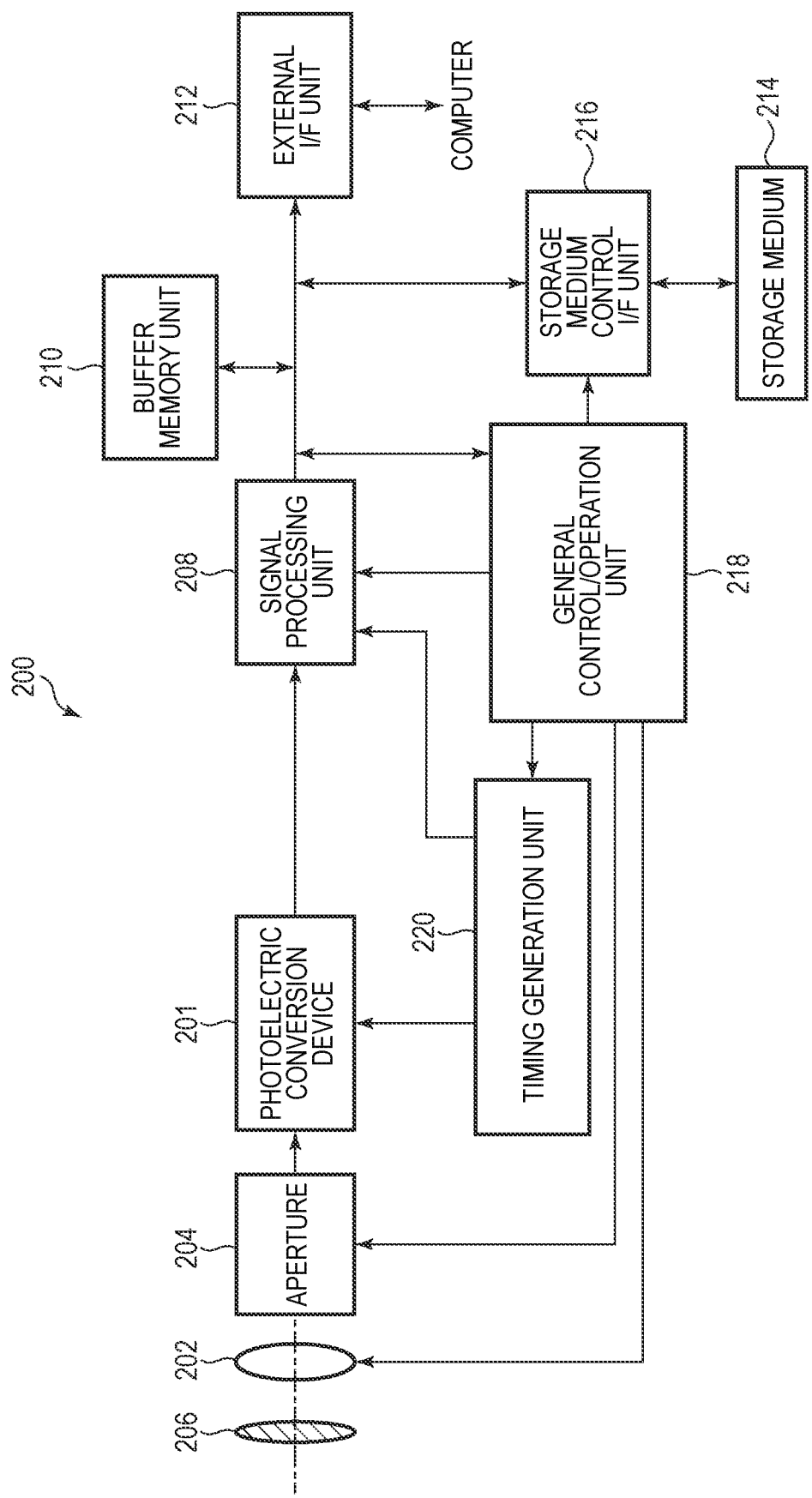
FIG. 14 is a block diagram illustrating a schematic configuration of an imaging system according to a seventh embodiment of the present invention.

An imaging system according to a seventh embodiment of the present invention will be described with reference to FIG. 14. FIG. 14 is a block diagram illustrating a schematic configuration of the imaging system according to the present embodiment.

The photoelectric conversion device 100 described in the first to sixth embodiments may be applied to various imaging systems. Examples of applicable imaging systems include digital still cameras, digital camcorders, surveillance cameras, copying machines, facsimiles, mobile phones, on-vehicle cameras, observation satellites, and the like. A camera module including an optical system such as a lens and an imaging device is also included in the imaging system. FIG. 14 is a block diagram of a digital still camera as an example of these.

The imaging system 200 illustrated in FIG. 14 includes an imaging device 201, a lens 202 for forming an optical image of an object on the imaging device 201, an aperture 204 for varying an amount of light passing through the lens 202, and a barrier 206 for protecting the lens 202. The lens 202 and the aperture 204 form an optical system that collect light on the imaging device 201. The imaging device 201 is the photoelectric conversion device 100 described in any of the first to sixth embodiments, and converts the optical image formed by the lens 202 into image data.

The imaging system 200 also includes a signal processing unit 208 that processes a signal output from the imaging device 201. The signal processing unit 208 generates image data from a digital signal output from the imaging device 201. The signal processing unit 208 performs various corrections and compressions as necessary and outputs the processed image data. The imaging device 201 may include an AD conversion unit that generates a digital signal to be processed by the signal processing unit 208. The AD conversion unit may be formed on a semiconductor layer (semiconductor substrate) in which the photoelectric converter of the imaging device 201 is formed, or may be formed on a semiconductor substrate different from the semiconductor layer on which the photoelectric converter of the imaging device 201 is formed. The signal processing unit 208 may be formed on the same semiconductor layer as the imaging device 201.

The imaging system 200 further includes a buffer memory unit 210 for temporarily storing image data, and an external interface unit (external I/F unit) 212 for communicating with an external computer or the like. Further, the imaging system 200 includes a storage medium 214 such as a semiconductor memory for storing or reading out the imaging data, and a storage medium control interface unit (storage medium control I/F unit) 216 for storing or reading out the imaging data on or from the storage medium 214. The storage medium 214 may be built in the imaging system 200, or may be detachable.

The imaging system 200 further includes a general control/operation unit 218 that controls various calculations and operations of the entire digital still camera, and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs the imaging signal to the signal processing unit 208. The signal processing unit 208 performs predetermined signal processing on the imaging signal output from the imaging device 201, and outputs image data. The signal processing unit 208 generates an image using the imaging signal.

As described above, according to the present embodiment, it is possible to realize an imaging system to which the photoelectric conversion device 100 according to the first to sixth embodiments is applied.

Eighth Embodiment

Figure 15A:
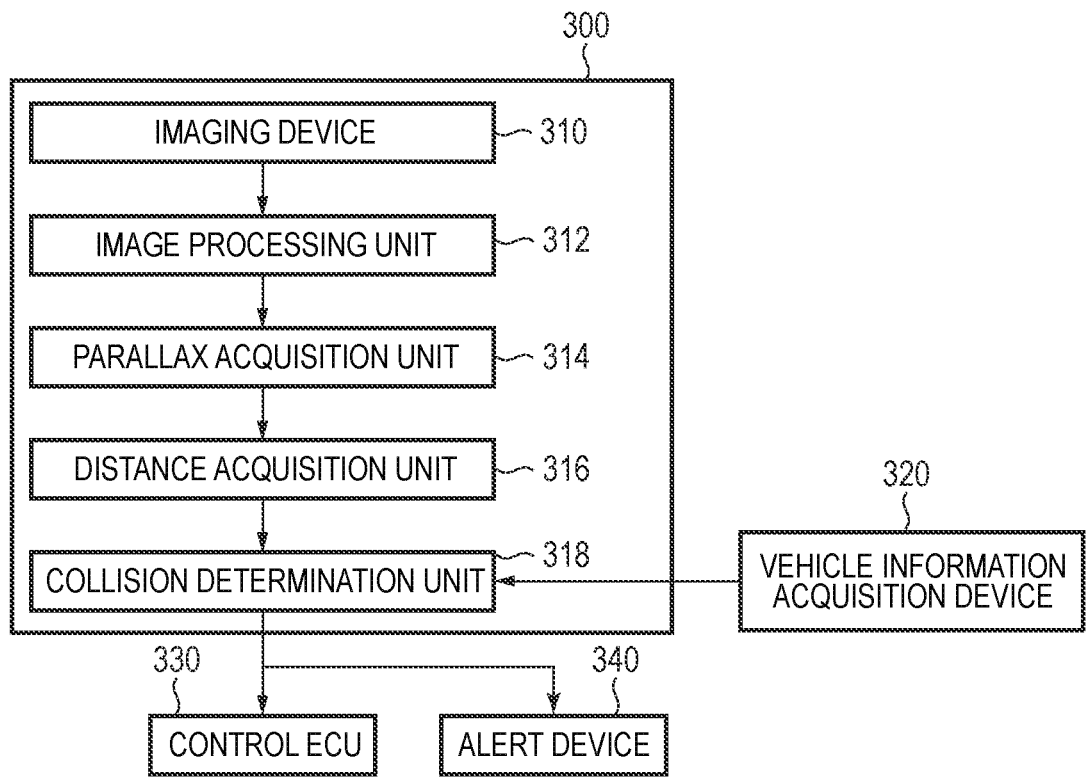
FIG. 15A is a diagram illustrating a configuration example of an imaging system according to an eighth embodiment of the present invention.
Figure 15B:
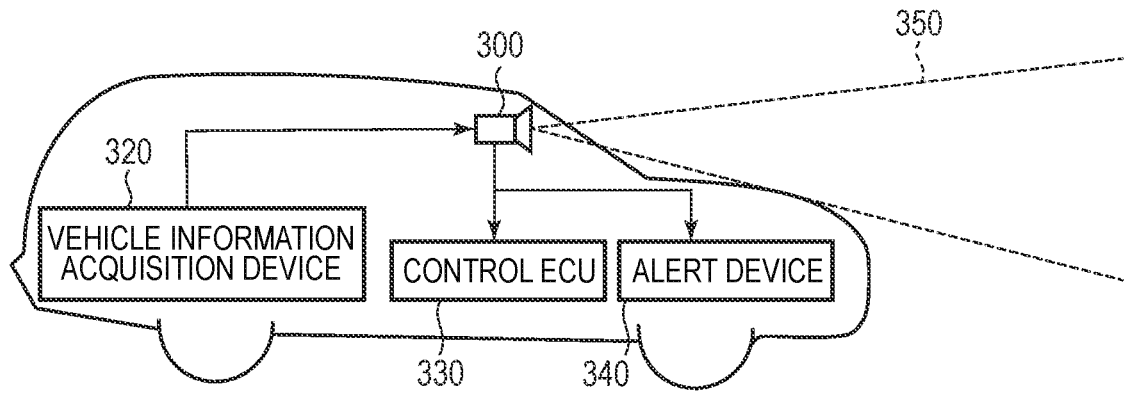
FIG. 15B is a diagram illustrating a configuration example of a movable object according to the eighth embodiment of the present invention.

An imaging system and a movable object according to an eighth embodiment of the present invention will be described with reference to FIG. 15A and FIG. 15B. FIG. 15A is a diagram illustrating the configuration of the imaging system according to the present embodiment. FIG. 15B is a diagram illustrating a configuration of a movable object according to the present embodiment.

FIG. 15A illustrates an example of an imaging system relating to an on-vehicle camera. The imaging system 300 includes an imaging device 310. The imaging device 310 is the photoelectric conversion device 100 described in any one of the first to sixth embodiments. The imaging system 300 includes an image processing unit 312 that performs image processing on a plurality of image data acquired by the imaging device 310, and a parallax acquisition unit 314 that calculates parallax (phase difference of parallax images) from the plurality of image data acquired by the imaging device 310. The imaging system 300 includes a distance acquisition unit 316 that calculates a distance to an object based on the calculated parallax, and a collision determination unit 318 that determines whether or not there is a possibility of collision based on the calculated distance. Here, the parallax acquisition unit 314 and the distance acquisition unit 316 are examples of a distance information acquisition unit that acquires distance information to the object. That is, the distance information may be information on a parallax, a defocus amount, a distance to the object, and the like. The collision determination unit 318 may determine the collision possibility using any of these pieces of distance information. The distance information acquisition unit may be implemented by dedicated hardware or software modules. Further, it may be implemented by FPGA (Field Programmable Gate Array), ASIC (Application Specific Integrated circuit), or the like, or may be implemented by a combination of these.

The imaging system 300 is connected to a vehicle information acquisition device 320, and may acquire vehicle information such as a vehicle speed, a yaw rate, and a steering angle. Further, the imaging system 300 is connected to a control ECU 330 which is a control device that outputs a control signal for generating a braking force to the vehicle based on the determination result of the collision determination unit 318. The imaging system 300 is also connected to an alarm device 340 that issues an alert to the driver based on the determination result of the collision determination unit 318. For example, when the collision possibility is high as the determination result of the collision determination unit 318, the control ECU 330 performs vehicle control to avoid collision and reduce damage by braking, returning an accelerator, suppressing engine output, or the like. The alarm device 340 alerts a user by sounding an alarm such as a sound, displaying alert information on a screen of a car navigation system or the like, or giving vibration to a seat belt or a steering wheel.

In the present embodiment, the imaging system 300 images the periphery of the vehicle, for example, the front or the rear. FIG. 15B illustrates an imaging system in the case of imaging an image in front of a vehicle (an imaging range 350). The vehicle information acquisition device 320 sends an instruction to the imaging system 300 or the imaging device 310. With such a configuration, the accuracy of distance measurement may be further improved.

In the above description, an example has been described in which control is performed so as not to collide with other vehicles, but the present invention is also applicable to control of automatic driving following other vehicles, control of automatic driving so as not to go out of a lane, and the like. Further, the imaging system is not limited to a vehicle such as a host vehicle, and may be applied to, for example, a movable object (moving device) such as a ship, an aircraft, or an industrial robot. In addition, the present invention may be applied not only to a movable object but also to a wide variety of equipment such as ITS (Intelligent Transport Systems).

Ninth Embodiment

Figure 16:
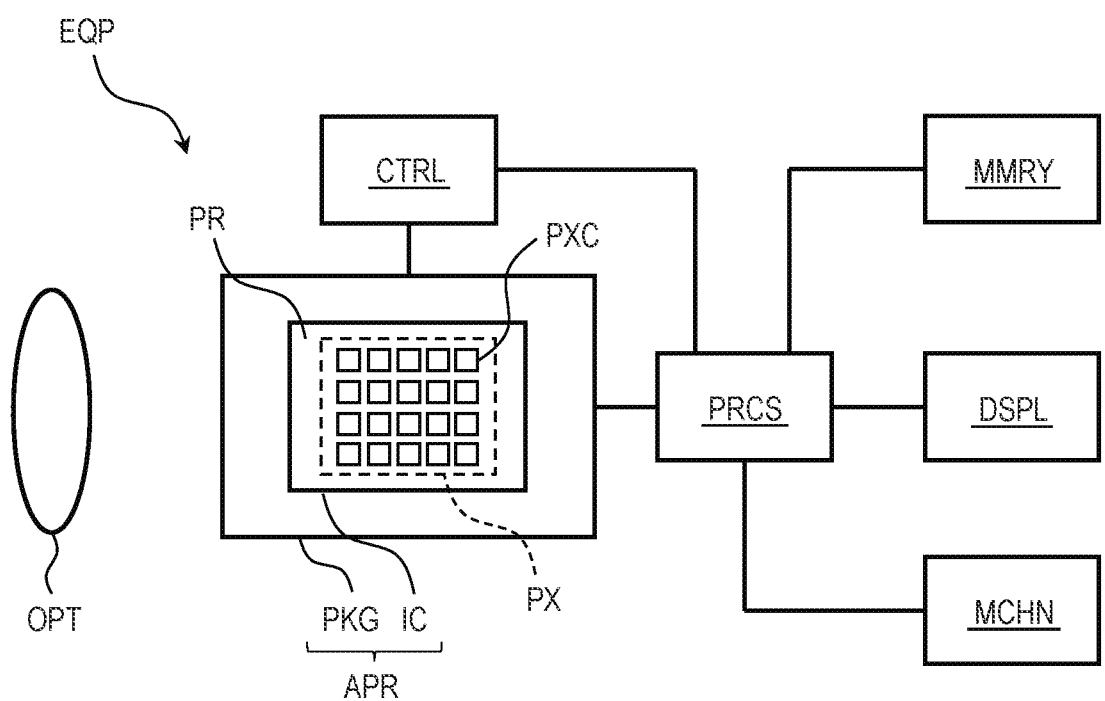
FIG. 16 is a block diagram illustrating a schematic configuration of equipment according to a ninth embodiment of the present invention.

Equipment according to a ninth embodiment of the present invention will be described with reference to FIG. 16. FIG. 16 is a block diagram illustrating a schematic configuration of equipment according to the present embodiment.

FIG. 16 is a schematic diagram illustrating equipment EQP including the photoelectric conversion device APR. The photoelectric conversion device APR has the function of the photoelectric conversion device 100 according to any one of the first to sixth embodiments. All or a part of the photoelectric conversion device APR is a semiconductor device IC. The photoelectric conversion device APR of this example may be used, for example, as an image sensor, an AF (Auto Focus) sensor, a photometry sensor, or a distance measurement sensor. The semiconductor device IC includes a pixel area PX in which pixel circuits PXC including photoelectric converters are arranged in a matrix. The semiconductor device IC may include a peripheral area PR around the pixel area PX. Circuits other than the pixel circuits may be arranged in the peripheral area PR.

The photoelectric conversion device APR may have a structure (chip stacked structure) in which a first semiconductor chip provided with a plurality of photoelectric converters and a second semiconductor chip provided with peripheral circuits are stacked. Each peripheral circuit in the second semiconductor chip may be a column circuit corresponding to a pixel column of the first semiconductor chip. The peripheral circuits in the second semiconductor chip may be matrix circuits corresponding to the pixels or the pixel blocks of the first semiconductor chip. As a connection between the first semiconductor chip and the second semiconductor chip, a through electrode (TSV (Through Silicon Via)), an inter-chip interconnection by direct bonding of a conductor such as copper, a connection by micro bumps between chips, a connection by wire bonding, or the like may be adopted.

In addition to the semiconductor device IC, the photoelectric conversion device APR may include a package PKG that accommodates the semiconductor device IC. The package PKG may include a base body to which the semiconductor device IC is fixed, a lid body made of glass or the like facing the semiconductor device IC, and a connection member such as a bonding wire or a bump that connects a terminal provided on the base body to a terminal provided on the semiconductor device IC.

The equipment EQP may further comprise at least one of an optical device OPT, a control device CTRL, a processing device PRCS, a display device DSPL, a storage device MMRY, and a mechanical device MCHN. The optical device OPT corresponds to the photoelectric conversion device APR as a photoelectric conversion device, and is, for example, a lens, a shutter, or a mirror. The control device CTRL controls the photoelectric conversion device APR, and is, for example, a semiconductor device such as an ASIC. The processing device PRCS processes a signal output from the photoelectric conversion device APR, and constitutes an AFE (analog front end) or a DFE (digital front end). The processing unit PRCS is a semiconductor device such as a CPU (central processing unit) or an ASIC. The display device DSPL may be an EL (electroluminescent)

display device or a liquid crystal display device which displays information (image) obtained by the photoelectric conversion device APR. The storage device MMRY may be a magnetic device or a semiconductor device that stores information (image) obtained by the photoelectric conversion device APR. The storage device MMRY may be a volatile memory such as an SRAM or a DRAM, or a nonvolatile memory such as a flash memory or a hard disk drive. The mechanical device MCHN includes a movable portion or a propulsion portion such as a motor or an engine. In the equipment EQP, a signal output from the photoelectric conversion device APR may be displayed on the display device DSPL, and is transmitted to the outside by a communication device (not illustrated) included in the equipment EQP. Therefore, it is preferable that the equipment EQP further includes a storage device MMRY and a processing device PRCS separately from the storage circuit unit and the arithmetic circuit unit included in the photoelectric conversion device APR.

The equipment EQP illustrated in FIG. 16 may be an electronic device such as an information terminal (for example, a smartphone or a wearable terminal) having a photographing function or a camera (for example, an interchangeable lens camera, a compact camera, a video camera, and a surveillance camera.). The mechanical device MCHN in the camera may drive components of the optical device OPT for zooming, focusing, and shutter operation. The equipment EQP may be a transportation device (movable object) such as a vehicle, a ship, or an airplane. The equipment EQP may be a medical device such as an endoscope or a CT scanner.

The mechanical device MCHN in the transport device may be used as a mobile device. The equipment EQP as a transport device is suitable for transporting the photoelectric conversion device APR, or for assisting and/or automating operation (manipulation) by an imaging function. The processing device PRCS for assisting and/or automating operation (manipulation) may perform processing for operating the mechanical device MCHN as a mobile device based on information obtained by the photoelectric conversion device APR.

The photoelectric conversion device APR according to the present embodiment may provide the designer, the manufacturer, the seller, the purchaser, and/or the user with high value. Therefore, when the photoelectric conversion device APR is mounted on the equipment EQP, the value of the equipment EQP may be increased. Therefore, in order to increase the value of the equipment EQP, it is advantageous to determine the mounting of the photoelectric conversion device APR of the present embodiment on the equipment EQP when the equipment EQP is manufactured and sold.

Modified Embodiments

The present invention is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the present invention.

In the first to sixth embodiments, one vertical output line 16 is provided in each column of the pixel array unit 10, but the number of vertical output lines 16 provided in each column of the pixel array unit 10 is not limited to one, and may be two or more.

The circuit configuration of the pixel 12 illustrated in FIG. 2 is an example, and may be changed as appropriate. For example, each pixel 12 may include two or more photoelectric conversion elements. In this case, a plurality of photoelectric conversion elements may share one FD node. Further, a plurality of photoelectric conversion elements may comprise a pupil-division pixel sharing one microlens so that phase difference may be detected. The pixel 12 does not necessarily have to include the select transistor M4. The capacitance value of the node FD may be switchable.

The imaging systems described in the seventh and eighth embodiments are examples of imaging systems to which the photoelectric conversion device of the present invention may be applied, and imaging systems to which the photoelectric conversion device of the present invention may be applied are not limited to the configurations illustrated in FIG. 14 and FIG. 15A.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-012748, filed Jan. 31, 2022 which is hereby incorporated by reference herein in its entirety.

What is claimed is:
1. A photoelectric conversion device comprising:
a plurality of pixels arranged to form a plurality of columns;
a plurality of comparison circuits provided corresponding to the plurality of columns, each of the plurality of comparison circuits including a first input node to which a pixel signal output from a pixel of a corre- sponding column is input and a second input node to which a reference signal is input;

a plurality of buffer circuits provided between a reference signal line to which the reference signal is supplied and each of the second input nodes of the plurality of comparison circuits; and a first switch circuit configured to set a connection state between output nodes of the plurality of buffer circuits.

2. The photoelectric conversion device according to claim 1, wherein the plurality of buffer circuits includes a first set including a part of the plurality of buffer circuits and a second set including another part of the plurality of buffer circuits, and wherein the first switch circuit includes a first circuit configured to set a connection state between the output nodes of the buffer circuits of the first set and a second circuit configured to set a connection state between the output nodes of the buffer circuits of the second set independently of the first circuit.

3. The photoelectric conversion device according to claim 2, wherein the buffer circuits of the first set and the buffer circuits of the second set are alternately arranged.

4. The photoelectric conversion device according to claim 2 further comprising:

a plurality of output lines provided corresponding to the plurality of columns, each of the plurality of output lines being configured to output the pixel signal from the pixel of the corresponding column; and a second switch circuit configured to set a connection state between the plurality of output lines.

5. The photoelectric conversion device according to claim 4, wherein the second switch circuit includes a first circuit configured to set a connection state between output lines of columns in which the buffer circuits of the first set are arranged, and a second circuit configured to set a connection state between output lines of columns in which the buffer circuits of the second set are arranged independently of the first circuit.

6. The photoelectric conversion device according to claim 4 further comprising a first capacitor connected between the output line and the first input node.

7. The photoelectric conversion device according to claim 1 further comprising a control circuit configured to control the plurality of comparison circuits, wherein each of the plurality of comparison circuits includes a reset switch configured to reset a threshold voltage to a voltage corresponding to a potential difference between the first input node and the second input node, and wherein the control circuit is configured to turn on the reset switch during at least a part of a period in which the first switch circuit is turned on.

8. The photoelectric conversion device according to claim 2 further comprising a control circuit configured to control the plurality of comparison circuits, wherein each of the plurality of comparison circuits includes a reset switch configured to reset a threshold voltage to a voltage corresponding to a potential difference between the first input node and the second input node, and wherein the control circuit is configured to turn on the reset switch and switch the reset switch from on to off, during a period in which the first circuit of the first switch circuit is on and the second circuit is off.

9. The photoelectric conversion device according to claim 8, wherein the plurality of comparison circuits includes a first set of comparison circuits arranged in the same columns as the buffer circuits of the first set and a second set of comparison circuits arranged in the same columns as the buffer circuits of the second set, and wherein a voltage of the reference signal line is different between a timing at which the reset switch of the comparison circuit of the first set is switched from on to off and a timing at which the reset switch of the comparison circuit of the second set is switched from on to off.

10. The photoelectric conversion device according to claim 1 further comprising:

a plurality of dummy buffer circuits provided corresponding to the plurality of columns; and a third switch circuit provided between the reference signal line, and the plurality of buffer circuits and the plurality of dummy buffer circuits, wherein the reference signal line includes a first reference signal line configured to supply a first reference signal and a second reference signal line configured to supply a second reference signal, and wherein the third switch circuit is configured to connect the first reference signal line to one of the buffer circuit and the dummy buffer circuit in each of the plurality of columns and connect the second reference signal line to the other of the buffer circuit and the dummy buffer circuit in each of the plurality of columns.

11. The photoelectric conversion device according to claim 1, wherein the plurality of buffer circuits is provided in parallel between the reference signal line and the plurality of comparison circuits.

12. The photoelectric conversion device according to claim 1, wherein the plurality of buffer circuits is provided in series on a path through which the reference signal is supplied.

13. The photoelectric conversion device according to claim 1 further comprising a second capacitor connected between the buffer circuit and the second input node.

14. The photoelectric conversion device according to claim 1, wherein each of the plurality of comparison circuits is configured to compare the pixel signal with the reference signal whose level changes with lapse of time, and to output a comparison signal indicating a different level in a case where a difference between the pixel signal and the reference signal is smaller than a threshold value and a case where the difference between the pixel signal and the reference signal is larger than the threshold value.

15. An imaging system comprising:

the photoelectric conversion device according to claim 1; and a signal processing device configured to process a signal output from the photoelectric conversion device.

16. A movable object comprising:

the photoelectric conversion device according to claim 1;

a distance information acquisition unit configured to acquire distance information to an object from a parallax image based on a signal from the photoelectric conversion device; and a control unit configured to control the movable object based on the distance information.

17. Equipment comprising:

the photoelectric conversion device according to claim 1; and at least one of an optical device corresponding to the photoelectric conversion device, a control device configured to control the photoelectric conversion device, a processing device configured to process a signal output from the photoelectric conversion device, a mechanical device that is controlled based on information obtained by the photoelectric conversion device, a display device configured to display information obtained by the photoelectric conversion device, and a storage device configured to store information obtained by the photoelectric conversion device.

18. A photoelectric conversion device comprising:

a plurality of pixels arranged to form a plurality of columns;

a plurality of comparison circuits provided corresponding to the plurality of columns, each of the plurality of comparison circuit including a first input node to which a pixel signal output from a pixel of a corresponding column is input via a first capacitor and a second input node to which a reference signal is input via a second capacitor;

a plurality of buffer circuits provided between the reference signal line to which the reference signal is supplied and each of the second input nodes of the plurality of comparison circuits;

a switch circuit configured to switch a connection state between output nodes of the plurality of buffer circuits; and a control circuit configured to control the switch circuit, wherein the comparison circuit is enabled to perform an offset clamp operation of setting an offset based on voltages input to the first input node and the second input node, and wherein the control circuit is configured to connect between the output nodes of the plurality of buffer circuits during at least a part of a period during which the offset clamp operation is performed.

19. The photoelectric conversion device according to claim 18, wherein the control circuit is configured to disconnect the output nodes of the plurality of buffer circuits after the offset clamp operation ends.

20. A method of driving a photoelectric conversion device including a plurality of pixels arranged to form a plurality of columns, a plurality of comparison circuits provided corresponding to the plurality of columns and including a first input node to which a pixel signal output from a pixel of a corresponding column is input and a second input node to which a reference signal is input, a plurality of buffer circuits provided between a reference signal line to which the reference signal is supplied and each of the second input nodes of the plurality of comparison circuits, and a switch circuit configured to be enabled to switch a connection state between output nodes of the plurality of buffer circuits, the method comprising:

connecting the output nodes of the plurality of buffer circuits by turning on the switch circuit in a first operation mode; and disconnecting the output nodes of the plurality of buffer circuits by turning off the switch circuit in a second operation mode.

21. A method of driving a photoelectric conversion device including a plurality of pixels arranged to form a plurality of columns, a plurality of comparator circuits provided corresponding to the plurality of columns and including a first input node to which a pixel signal output from a pixel of a corresponding column is input, a second input node to which a reference signal is input, and a reset switch configured to reset a threshold voltage to a voltage corresponding to a potential difference between the first input node and the second input node, a plurality of buffer circuits provided between a reference signal line to which the reference signal is supplied and each of the second input nodes of the plurality of comparison circuits, and a switch circuit configured to be enabled to switch a connection state between output nodes of the plurality of buffer circuits, the method comprising:

connecting the output nodes of the plurality of buffer circuits by turning on the switch circuit; and turning on the switch circuit during at least a part of a period in which the reset switch is turned on.

22. The method of driving a photoelectric conversion device according to claim 21, wherein the reset switch is turned on during a period in which the switch circuit is turned on.

* * * * *